(12) United States Patent
Fossum et al.

(10) Patent No.: US 8,498,140 B2
(45) Date of Patent: Jul. 30, 2013

(54) TWO-TRANSISTOR FLOATING-BODY DYNAMIC MEMORY CELL

(75) Inventors: Jerry G. Fossum, Gainesville, FL (US); Leo Mathew, Austin, TX (US); Michael Sadd, Austin, TX (US); Vishal P. Trivedi, Chandler, AZ (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 362 days.

(21) Appl. No.: 12/681,289

(22) PCT Filed: Oct. 1, 2008

(86) PCT No.: PCT/US2008/078460
§ 371 (c)(1),
(2), (4) Date: Aug. 20, 2010

(87) PCT Pub. No.: WO2009/046114
PCT Pub. Date: Apr. 9, 2009

(65) Prior Publication Data
US 2010/0329043 A1     Dec. 30, 2010

Related U.S. Application Data

(60) Provisional application No. 60/976,691, filed on Oct. 1, 2007, provisional application No. 61/017,941, filed on Dec. 31, 2007.

(51) Int. Cl.
| | |
|---|---|
| *G11C 5/02* | (2006.01) |
| *G11C 5/06* | (2006.01) |
| *G11C 7/00* | (2006.01) |
| *G11C 11/401* | (2006.01) |
| *G11C 11/4063* | (2006.01) |
| *G11C 11/40* | (2006.01) |

(52) U.S. Cl.
USPC ............... 365/72; 365/51; 365/63; 365/184; 365/189.011; 257/347; 257/E27.111

(58) Field of Classification Search
USPC ............... 365/186, 187, 188, 189.011, 51, 365/63, 72, 184; 257/347, E27.111
See application file for complete search history.

(56) References Cited

U.S. PATENT DOCUMENTS

| | | | | |
|---|---|---|---|---|
| 5,784,311 | A * | 7/1998 | Assaderaghi et al. | 365/150 |
| 5,821,769 | A * | 10/1998 | Douseki | 326/34 |
| 6,111,778 | A * | 8/2000 | MacDonald et al. | 365/149 |
| 6,560,142 | B1 * | 5/2003 | Ando | 365/177 |
| 7,085,153 | B2 | 8/2006 | Ferrant et al. | |
| 7,184,298 | B2 | 2/2007 | Fazan et al. | |
| 7,230,846 | B2 | 6/2007 | Keshavarzi et al. | |
| 2002/0112137 | A1 * | 8/2002 | Houston | 711/200 |
| 2005/0078546 | A1 * | 4/2005 | Hirano et al. | 365/232 |

(Continued)

OTHER PUBLICATIONS

Rodriguez, N., et al., "A-RAM: Novel Capacitor-Less DRAM Memory," 2009 IEEE International SOI Conference, Oct. 2009, pp. 1-2.

(Continued)

*Primary Examiner* — J. H. Hur
(74) *Attorney, Agent, or Firm* — Saliwanchik, Lloyd & Eisenschenk

(57) ABSTRACT

Embodiments relate to a two-transistor (2T) floating-body cell (FBC) for embedded-DRAM applications. Further embodiments pertain to a floating-body/gate cell (FBGC), which yields reduction in power dissipation, in addition to better signal margin, longer data retention, and higher memory density.

35 Claims, 19 Drawing Sheets

U.S. PATENT DOCUMENTS

2005/0094434 A1* 5/2005 Watanabe et al. ............ 365/156
2006/0187706 A1 8/2006 Tang et al.
2006/0227601 A1* 10/2006 Bhattacharyya ............ 365/177

OTHER PUBLICATIONS

Kim, K. et al., "DRAM technology perspective for gigabit era," *IEEE Trans. Electron Devices*, Mar. 1998, pp. 598-608, vol. 45.

Okhonin, S., et al., "A capacitor-less 1T-DRAM cell," *IEEE Electron Device Lett.*, Feb. 2002, pp. 85-87, vol. 23.

Ranica, R., et al., "A capacitor-less DRAM cell on 75 nm gate length, 16 nm thin fully depleted SOI device for high density embedded memories," *IEDM Tech. Dig.*, Dec. 2004, pp. 277-280.

Yoshida, E., et al., "A study of highly scalable DG-FinDRAM," *IEEE Electron Device Lett.*, Sep. 2005, pp. 655-657, vol. 26.

Nagoga, M., et al., "Retention characteristics of zero-capacitor RAM (Z-RAM) cell based on FinFET and tri-gate devices," *Proc. IEEE Internat. SOI Conf.*, Oct. 2005, pp. 203-204.

Yoshida, E., et al., "A capacitorless 1T-DRAM technology using gate-induced drain-leakage (GIDL) current for low-power and high-embedded memory," *IEEE Trans. Electron Devices*, Apr. 2006, pp. 692-697, vol. 53.

Hamamoto, T., et al., "A floating-body cell fully compatible with 90-nm CMOS technology node for a 128-nm DRAM and its scalability," *IEEE Trans. Electron Devices*, Mar. 2007, pp. 563-571, vol. 54.

Moore, S. K., "Masters of memory," *IEEE Spectrum*, Jan. 2007, pp. 45-49.

Fossum, J. G. et al., "New insights on "capacitorless" floating-body DRAM cells," *IEEE Electron Device Lett.*, Jun. 2007, pp. 513-516, vol. 28.

Fossum, J. G., et al., "Pragmatic Design of Nanoscale Multi-Gate CMOS," *Tech. Digest 2004 Internat. Electron Devices Meeting*, Dec. 2004, pp. 613-616.

Mathew, L., et al., "Inverted-T Channel FET (ITFET)—A Novel Technology for 45 nm-and-Beyond CMOS," *IEDM Tech. Dig.*, Dec. 2005, pp. 731-734.

Trivedi, V. et al., J. G. Fossum, and M. M. Chowdhury, "Nanoscale FinFETs with gate-source/drain underlap," *IEEE Trans. Electron Devices*, Jan. 2005, pp. 56-62, vol. 52.

Kim, S.H., et al., "Modeling and significance of fringe capacitance in nonclassical CMOS devices with gate-source/drain underlap," *IEEE Trans. Electron Devices*, Sep. 2006, pp. 2143-2150, vol. 53.

Lu, Z., et al., "A Novel Two-Transistor Floating-Body/Gate Cell for Low-Power Nanoscale Embedded DRAM," *IEEE Trans. Electron Devices*, Jun. 2008, p. 1511, vol. 55.

Trivedi, V. P., et al., "Threshold voltage and bulk inversion effects in nonclassical CMOS devices with undoped ultra-thin bodies," *Solid-State Electron.*, Jan. 2007, p. 170, vol. 51.

* cited by examiner (a)

(b)

TWO-TRANSISTOR FLOATING-BODY DYNAMIC MEMORY CELL

CROSS-REFERENCE TO RELATED APPLICATIONS

The present application is the U.S. National Stage Application of International Patent Application No. PCT/US2008/078460, filed on Oct. 1, 2008, which claims the benefit of U.S. Provisional Application Ser. No. 60/976,691, filed Oct. 1, 2007, and claims the benefit of U.S. Provisional Application Ser. No. 61/017,941, filed Dec. 31, 2007, all of which are hereby incorporated by reference herein in their entirety, including any figures, tables, or drawings.

BACKGROUND OF INVENTION

A conventional dynamic random access memory (DRAM) cell uses a stack capacitor or a deep-trench capacitor for storage, which is leading to prohibitive processing complexity as the memory technology is scaled [1]. Accordingly, study and development of "capacitorless" one-transistor (1T) DRAM cells that utilize the floating body of a silicon-on-insulator (SOI) metal oxide semiconductor field effect transistor (MOSFET) as the storage element have intensified [2]-[9], mainly for complementary metal oxide semiconductor (CMOS) embedded-memory applications [10]. In such 1T floating-body cells (FBCs), charging and discharging the MOSFET body define the memory states, and the stored data are sensed via a difference, or signal margin, in the channel current ($\Delta I_{DS}$) corresponding to the threshold-voltage variation ($\Delta V_t$) that results from the body charging/discharging, i.e., from the varying body-source junction voltage ($V_{BS}$) [11]. The widespread FBC studies, which began with partially depleted (PD) SOI MOSFETs [2], have recently focused on fully depleted (FD) devices, including planar FD/SOI MOSFETs [3], [8], [9] and FD double-gate (DG) FinFETs [4], [5], [7], to avoid body-doping issues [4] and to render the FBC more scalable with the CMOS. The FD devices require a substrate, or back-gate bias to create an accumulation layer that emulates the PD body, and enables effective charge storage and data sensing [11].

While FinFET CMOS technology could enable scaling of the 1T FBC to gate lengths ($L_g$) less than 10 nm [12], there are other issues that tend to inhibit mainstream adaptation of the 1T FBC utilizing FinFET technology. In particular, the 1T FBC utilizing FinFET technology relies on current sensing of the stored data, which can be less desirable than conventional voltage sensing because of more sophisticated sense amplifiers and added power consumption. The 1T FBC utilizing FinFET technology requires the noted bias-induced accumulation, which can complicate the cell/chip design, undermine reliability, and sacrifice layout area. In addition, because the attainable $\Delta V_t$ is fundamentally limited, several paralleled fins are needed to increase the device effective width and current to get acceptable $\Delta I_{DS}$, thus severely undermining the memory density actually achievable. For example, in the paper "Retention characteristics of zero-capacitor RAM (Z-RAM) cell based on FinFET and tri-gate devices," by Nagoda et al., with the SOI substrate biased at −30 V to get the needed accumulation, 10 fins yielded a current margin of less that 10 µA from an $L_g$=100 nm composite n-channel double gate (DG) FinFET.

Thus, there exists a need in the art for a scalable memory.

BRIEF SUMMARY

Embodiments of the present invention relate to memory. Embodiments of the present invention provide a DRAM that can be embedded in CMOS integrated logic circuits. Embodiments of a two-transistor memory cell are provided that can yield an improved scalability and performance compared to current one transistor memory cells. According to the present invention, one of the two transistors functions as a composite floating body/gate.

According to embodiments of the present invention a memory is provided utilizing a two-transistor memory cell where the body of the first transistor is coupled to the gate of the second transistor. A word line and two bit lines are used for manipulation of the two transistors. In one embodiment, the sources of the first and second transistor are coupled to ground, the drain of the first transistor is coupled to the first bit line, and the drain of the second transistor is coupled to the second bit line. In another embodiment, utilizing gate-induced drain leakage (GIDL) current (the floating body/gate cell (FBGC)), the source and drain of the first transistor are coupled to the first bit line, the drain of the second transistor is coupled to the second bit line, and the source of the second transistor is coupled to ground. In yet another embodiment, a modified FBGC is provided where the source region of the first transistor is implanted at high concentration with impurities of the same conductive type as the body of the first transistor. The source region having such implanted impurities can facilitate the coupling of the body of the first transistor structure to the gate of the second transistor. The first bit line can be coupled to only the drain of the first transistor structure.

For operation, write/erase functions involve charging and discharging the first transistor and read functions involve reading the second transistor. In one embodiment, reading the second transistor can be accomplished through the second bit line using current sensing. In another embodiment, the reading can be accomplished using voltage sensing.

Embodiments of the present invention can be applicable to any silicon-on-insulator (SOI) technology. In a specific embodiment, inverted-T FET (ITFET) technology can be used, in which the connection between the body of the first transistor and the gate of the second transistor is formed using a heavily doped planar SOI layer. Embodiments of the present invention can also be applicable to bulk silicon technology. Further embodiments can incorporate a stacked structure. For embodiments incorporating a stacked structure, the first transistor can be made in polysilicon and stacked on top of the second transistor.

DETAILED DISCLOSURE

Figure 1:
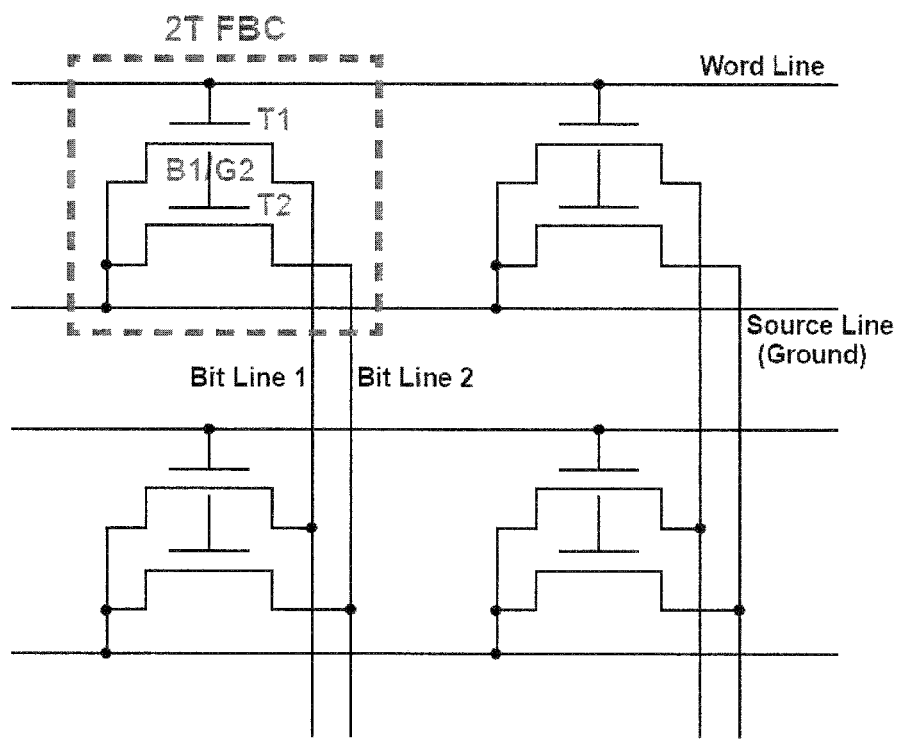
FIG. 1 shows a schematic of a dynamic memory array according to an embodiment of the present invention.

Embodiments of the present invention relate to memory. Embodiments of the subject technology provide a two-transistor floating-body cell for DRAM applications. An embodiment can involve a memory cell including a first transistor (T1) and a second transistor (T2), where the body (B1) of T1 is connected to the gate (G2) of T2. In operation, write/erase operations involve charging/discharging T1 and read operations involve reading T2. Three signal lines can be used: a word line, a first bit line, and a second bit line. In an embodiment, one bit line connects all drain nodes of the T1 transistors in a column of a DRAM array for programming the cells, and the second bit line connects all drain nodes of the T2 transistors in the column for sensing the data. The gate of T1 is tied to the word line.

In one embodiment, the source of T1 and the source of T2 are tied to ground. This embodiment can be referred to as a two-transistor floating body cell (2T-FBC). In another embodiment, the source of T1 is tied to the drain of T1, and the source of T2 is tied to ground. This embodiment can be referred to as the floating body/gate cell (FBGC) utilizing gate-induced drain leakage current. In yet another embodiment the source region of T1 can be made the same conductive type as the body of T1, and the source of T2 is tied to ground. This embodiment can be referred to as the modified FBGC where the modified source region facilitates the tying of the body of T1 to the gate of T2. Embodiments of the present invention can be applicable to any SOI technology. In addition, certain embodiments of the present invention are applicable to bulk silicon technology. Although preferred embodiments of the present invention utilize n-type transistor structures (such as nFinFET), embodiments of the present invention can also utilize p-type transistor structures but may require a larger cell area.

I. The 2T-FBC

The 2T-FBC provides an improvement with respect to the operation of the 1T FBC. In particular, the variation in $V_t$ that underlies the 1T-FBC operation is typically much less than the variation in $V_{BS}$ (~0.7V) driven by the body charging/discharging: $\Delta V_t = -r\Delta V_{BS}$ with the body factor r~0.3. This means that wide devices and large layout areas are needed for adequate $\Delta I_{DS}$, as mentioned previously. Second, the commonly used "potential well" description of the body charge storage is misleading. The FBC is not really "capacitorless;" it can actually have more than one intrinsic capacitor ($C_{Bi}$) supporting the charge ($Q_p$ in an nMOSFET) storage. The floating-body nodal equation can be given by:

$$I_G - I_R = \frac{dQ_p}{dt} = \sum_i C_{Bi} \frac{dV_{Bi}}{dt} \tag{1}$$

where $C_{Bi}$, with i=S, D, Gf, Gb, represents the capacitive coupling of the body to other terminals of the transistor; $Q_p$ is the majority-hole charge in the body, and $I_G$ and $I_R$ are hole generation (or injection) and recombination (or extraction) currents. Third, as noted above, voltage sensing is not an option for the 1T FBC.

Accordingly, a 2T FBC according to an embodiment of the present invention can be utilized. FIG. 1 shows a memory array based on an embodiment of the 2T FBC (T1 and T2 enclosed in the dashed square.). Referring to FIG. 1, a cell of the memory array incorporates transistors T1 and T2, with the body (B1) of T1 connected to, or driving the gate (G2) of T2. B1 represents the floating body storage node of T1 that is tied to the gate of T2. Accordingly, the $C_{Bi}$ in equation (1) is thus augmented by the gate capacitance of T2. The 2T concept is generic, meaning that it is applicable to any SOI technology. In addition, the 2T-FBC can also be fabricated on bulk silicon. For example, T1 can be a polysilicon device.

Figure 2:
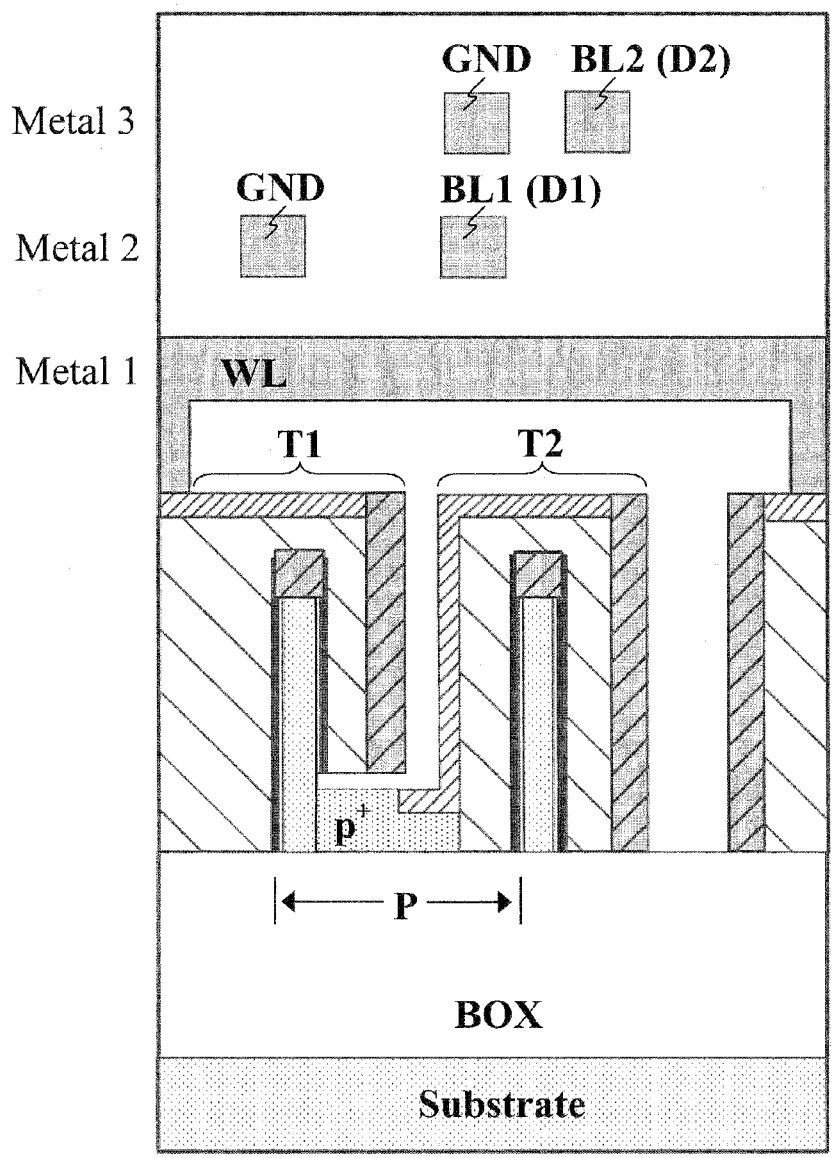
FIG. 2 shows a cross sectional layout view of a memory cell according to an embodiment of the present invention.

In one embodiment, FinFET technology can be utilized because FinFETs currently offer great scalability. In a specific embodiment, the 2T-cell structure can be fabricated, without area penalty due to the B1-G2 contact, via a double gate (DG) FinFET-based ITFET technology. FIG. 2 shows cross-sectional layout view of a 2T (n-channel) FBC fabricated via ITFET technology. Referring to FIG. 2, a planar SOI layer, doped p$^+$, can be used to make the B1-G2 connection of two n-channel DG FinFETs. The FinFET bodies can be formed undoped for improved scalability. Lateral diffusion of the p-type dopants in the SOI layer during activation can effectively dope the base of the T1 fin, thereby suppressing source-drain leakage current in it. The undoped FinFETs can be formed with near-midgap metal gates, and p$^+$ rather than n$^+$ polysilicon in the gate stack to enable the B1-G2 connection. The near-midgap metal can include, for example TiN. For $L_g \cong F/2$ (for which $t_{Si} \cong L_g/2$ and $h_{Si} \cong 4t_{Si}$ [12]), a unit cell area is estimated to be 13.75 F$^2$, which implies a potential area per margin much less than that of a 1T counterpart FBC.

Figure 3:
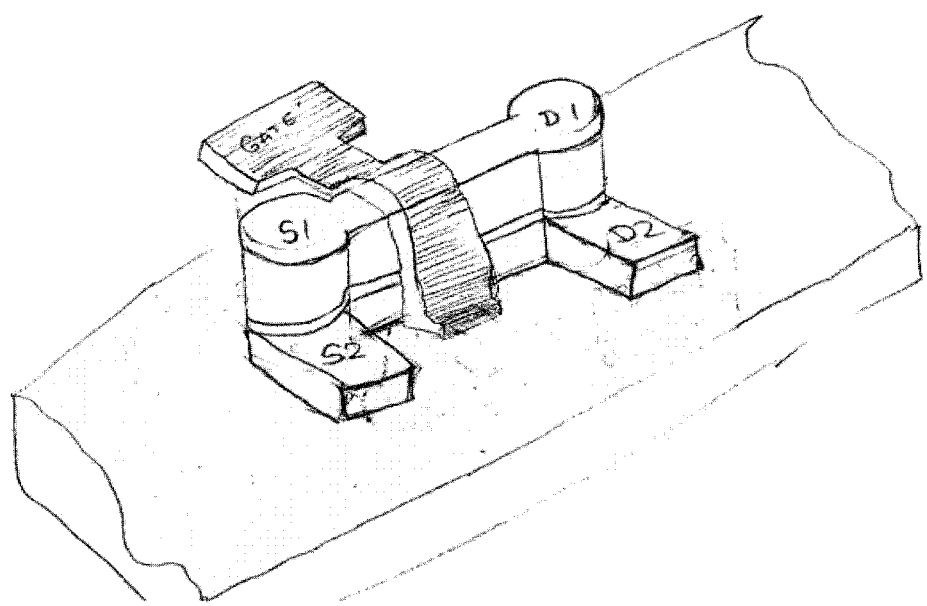
FIG. 3 shows a perspective view of a memory cell having a stacked structure according to an embodiment of the present invention.

Other embodiments for a layout of the 2T FBC can include, for example, a stacked transistor structure where one transistor is stacked on the other transistor. These structures can be provided on SOI or bulk silicon. One embodiment of such a stacked structure can be seen in FIG. 3. In FIG. 3, a first transistor structure includes a gate GATE, a first source S1, and a first drain D1; and a second transistor structure includes a second source S2 and a second drain D2. The gate of the second transistor structure is provided below the body of the first transistor structure as a double SOI or a polysilicon device. Other physical relationships between the transistor structures can be used in accordance with the invention.

The write/erase operations of the 2T FBC can be accomplished by charging/discharging the floating body of T1, as in the 1T FBC. But, the stored data are read via T2 with $\Delta V_{GS2} = \Delta V_{BS} > |\Delta V_t|$, which implies directly about a 2× (½r) density increase for the same current-signal margin. No substrate biasing is needed, even when the transistors are designed to be FD, such as with the DG FinFETs. However, two bit lines (per string) are used: a first bit line (BL1) connecting all drain nodes of the T1 transistors in a column of the DRAM array for programming the cells, and a second bit line (BL2) connecting all drain nodes of the T2 transistors in the column for sensing the data. The gate of T1 is tied to a word line (WL).

The stored data are read by, in essence, amplifying $V_{BS}$ of T1 with T2. Data can therefore be sensed via the induced drain-current variation in T2 with a current-sense amplifier, as in the 1T FBC cells, but with much better signal margin because $\Delta V_{BS} > |\Delta V_t|$. However, preferred voltage sensing at the (precharged) drain node of T2 (BL2), similar to the sensing used in the conventional DRAM technology, can be used. In this case, the 2T-FBC cell is designed such that T2 will be turned on and off by the charged/discharged T1 body in the '0' and '1' states, respectively. Note that since T2 inverts, stored '0' and '1' correspond to the T1 body being charged and discharged, respectively. For voltage sensing, embodiments involving two FinFETs can be designed with only one fin each, implying much less layout area than a FinFET-based 1T FBC with multiple fins.

The basic operation of an embodiment of the FinFET-based 2T FBC is simulated in Spice 3 using the process/physics-based compact model UFDG as described in *UFDG User's Guide (Ver. 3.7)*. J. G. Fossum, University of Florida, Gainesville, Fla. (2007), which is hereby incorporated by reference in its entirety. The charge modeling in UFDG is physically linked to the channel-current modeling. It accounts for all important transcapacitances, ensuring charge conservation, and is well-suited for dynamic FBC simulation. The $I_R$ and $I_G$ modeling in UFDG, including impact-ionization current ($I_{Gi}$) and gate-induced drain leakage current (GIDL) current, is also physical. Note that for the T1 body of the 2T FBC, a predominant charging current on the right-hand side of (1) is defined by the gate capacitance of T2: $C_{CG2}(dV_{B1/G2}/dt)$ where, in general, $C_{G2}$ is $V_{GS2}$-dependent.

Figure 4:
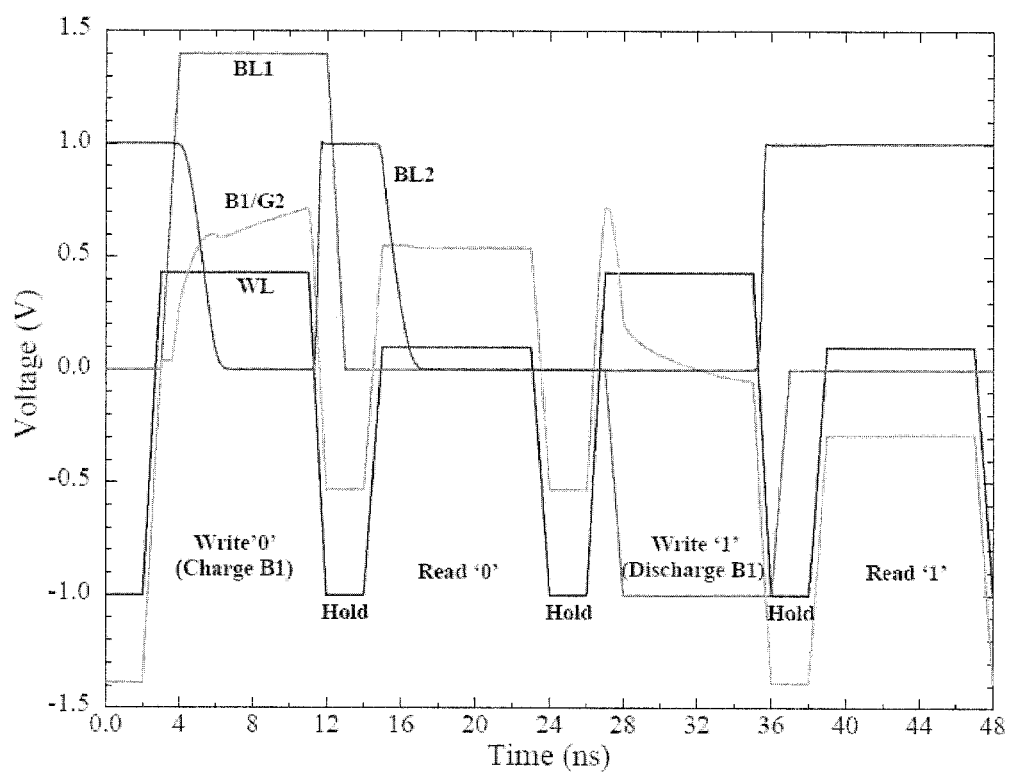
FIG. 4 shows a transient sequential operation of a memory cell according to an embodiment of the present invention predicted using UFDG/Spice3.

FIG. 4 shows a UFDG/Spice3-predicted transient sequential operation of a 28 nm DG nFinFET-based 2T FBC incorporating single-fin transistors with height 56 nm. Impact-ionization current was used for charging B1, and gate current and parasitic capacitance were neglected. For the read operations, BL2 was precharged to 1.0 V; the effective bit-line capacitance was assumed to be 20 fF, which corresponds roughly to a 512-bit line in the technology alluded to. The simulation assumes single-fin $L_g$=28 nm DG nFinFETs for T1 and T2, with undoped fin-body width and height of 14 nm and 56 nm, respectively, midgap metal gate, and 1 nm (EOT) gate oxide. The gate tunneling current and parasitic capacitance are neglected for this preliminary demonstration. The simulation further assumes an ideal B1-G2 connection, and the body of T2 is left floating like B1. The UFDG/Spice3-predicted operation [i.e., write '0' (charge T1 body), hold data/precharge BL2, read '0', hold data, write '1' (discharge T1 body), hold data/precharge BL2, and read '1'], for $I_{Gi}$; charging of B1, is shown in FIG. 4. As indicated, reasonable read/write times of 10 ns including pulse rise/fall times of 1 ns are assumed. The UFDG model predicts the expected trend of the B1/G2 voltage (i.e., $V_{BS}$ of T1) variation with gate (WL) and drain (BL1) biasing, as shown. A typical program window (or $V_{BS}$ signal margin) of $\cong 0.8V$ is predicted, as indicated by the difference of the B1/G2 voltage between the read-'0' and read-'1' operations.

Note that appropriate WL pulsing (to 0.1V here) for read operations is needed to move the B1/G2 voltage to a level sufficiently above or below $V_t$ of T2 for stored '0' or '1', respectively, with adequate $\Delta Q_p$ storage needed for the former. This operation is confirmed by the predicted transient drain (BL2) voltage of T2, which needs to be precharged before reading (to 1.0V here). Indeed, with the T1 body charged (stored '0'), BL2 drops quickly to 0V, as $V_{B1/G2}$ turns on T2; this corresponds to a read '0'. With the T1 body discharged (stored '1'), BL2 remains at its precharged value (1.0V) as $V_{B1/G2}$ remains well below $V_t$; this corresponds to a read '1'. Efficient reads of both '0' and '1' are demonstrated with reasonable WL and BL1 voltage pulsings.

Figure 5:
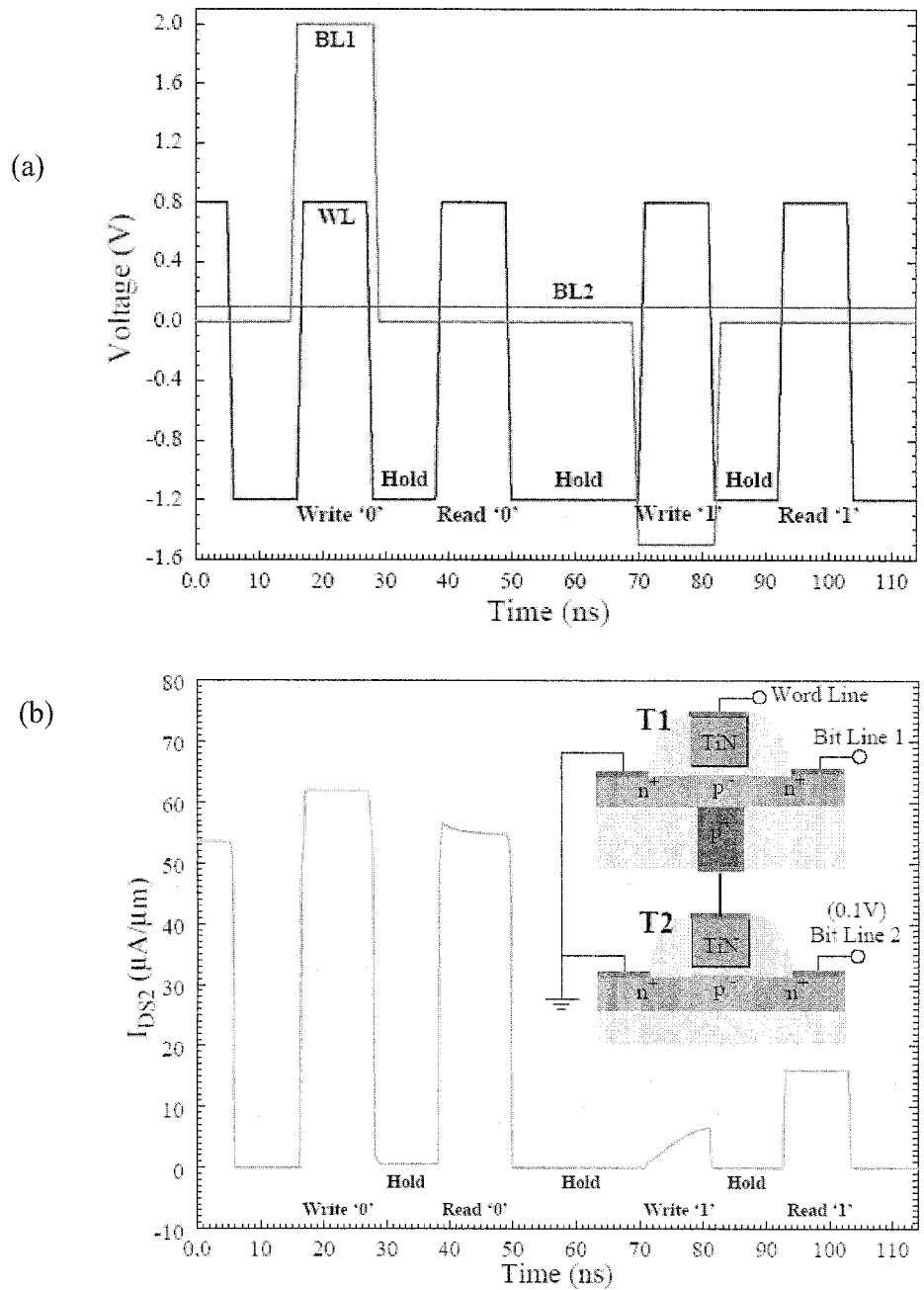
FIG. 5 shows a transient sequential operation of a memory cell according to an embodiment of the present invention predicted by a 2-D, mixed-mode simulation using Taurus.

A numerical mixed-mode simulation a 2T-FBC structure using Taurus is performed to provide corroboration regarding the assumed ideal B1-G2 connection and effective driving of the gate of T2 using the floating body of T1. FIG. 5 shows a transient sequential operation of a 2T FBC, analogous to the simulation of FIG. 4, predicted by a 2-D, mixed-mode simulation using Taurus. The assumed representative cell structure, with 28 nm single-gate FD/SOI nMOSFETs, is shown in the inset of (b), in which the data storage is reflected by the transient current in T2 driven by $V_{BS}$ of T1. The transient pulsings of the gate (WL) and drain (BL1) of T1, and the T2 drain (BL2) voltage fixed at 0.1 V for this simplified simulation are shown in (a). The read-'1' and read-'0' operations show the predicted signal margin, $\Delta I_{DS2} \cong 40 \mu A/\mu m$. To allow a 2-D simulation, a domain is defined with two 28 nm single-gate undoped FD/SOI nMOSFETs, linked by a p$^+$ polysilicon-TiN (with midgap work function) connect as shown in the inset of FIG. 5. Further, to facilitate the mixed-mode simulation, $V_{DS}$ of T2 is set to 0.1 V and it's the current ($I_{DS2}$) of T2 is monitored to check the functionality of the cell. Although the assumed 2T structure is simplified, the simulation results, shown in FIG. 5 for $I_{Gi}$; charging of T1, do corroborate the general operation of the 2T FBC as predicted by UFDG/Spice3. Indeed, the results demonstrate the basic operation of the cell with ns-scale write/read processes, showing that the floating B1 of T1 can effectively drive G2 of T2 and yield outstanding signal margin. The margin of the cell, reflected by the predicted $I_{DS2}(t)$, is substantively larger than that of the 1T counterpart, even though it is undermined some because of the unexpected finite read-'1' current. This current is due to the significant $Q_p$ stored on the forward-biased B-D junction of T1 during the write-'1' (discharge) process, which is supported by substantive $I_{Gi}$ with T1 in the inverse mode.

Data retention for embodiments of the 2T FBC, subject to BL1 and WL disturbs, can be at least comparable to that of the 1T cell, as exemplified for FinFET-based FBCs in "Retention characteristics of zero-capacitor RAM (Z-RAM) cell based on FinFET and tri-gate devices," by Nagoga et al., *Proc. IEEE Internat. SOI Conf*, pp. 203-204, October 2005 and "Floating body cell with independently-controlled double gates for high density memory," by Ban et al., *IEDM Tech. Dig.*, pp. 573-576, December 2006. Further, the enabled use of voltage sensing instead of current sensing with embodiments of the 2T-FBC array in accordance with the present invention can yield better retention.

II. The FBGC

Figure 6:
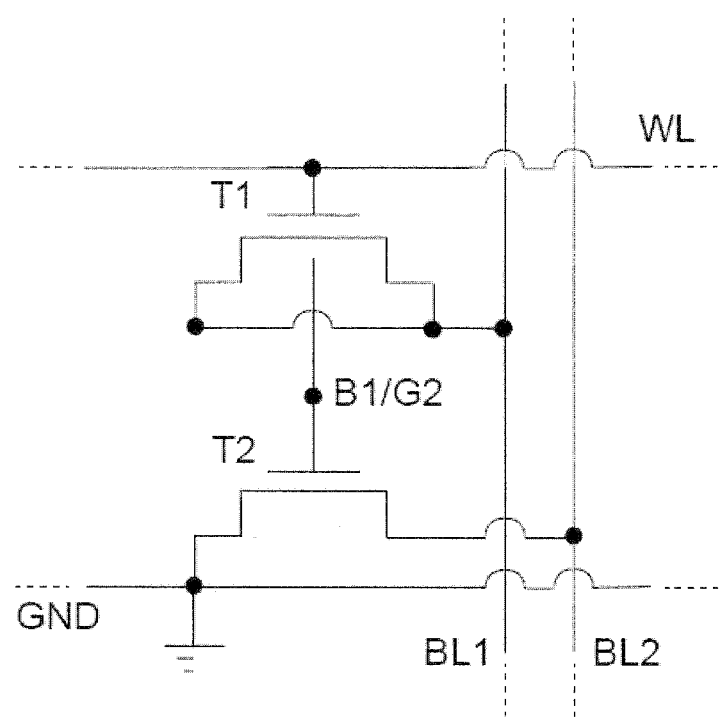
FIG. 6 shows a schematic of a memory cell according to a specific embodiment of the present invention, incorporating a FBGC structure in a DRAM array.

As discussed above, the 2T FBC affords much more design flexibility for optimizing performance than does the 1T FBC. Furthermore, additional embodiments, utilizing gate-induced drain leakage (GIDL) current (the floating body/gate cell (FBGC)), can also be used in memory applications. The body-charging power can be significantly reduced by using GIDL current, rather than impact-ionization current, for charging, but the body-discharging power remains high. For discharging, a forward bias is established on the body-drain junction by $V_{DS}<0$ and $V_{GS}>V_t$, and thus high channel current flows in the inverse mode [11]. A key feature of the FBGC is the drain (BL1) of T1 tied to the source, as illustrated in FIG. 6. As with the case of the 2T-FBC, the FBGC can be provided using n-channel or p-channel transistors on SOI or bulk silicon. FIG. 6 shows an embodiment of a FBGC structure in a DRAM array. The gate of T2 is driven by the body of T1. The source and drain of T1 are tied together, thereby effectively eliminating T1 channel current and effecting a floating body/gate on T2. This 2T configuration, with T1 effecting a floating body/gate on T2, can eliminate T1 channel current, and thus the excessive power dissipation when the body of T1 is discharged. Further, with GIDL-current charging, undermined signal margin due to $I_{Gi}$ noted with reference to FIG. 5 can be effectively eliminated as well. According to embodiments, T1 can be designed for GIDL current, i.e., with significant gate-source/drain overlap and $L_{eff} < L_g$, without much consideration of short-channel effects since it is not involved in the read operations. This is not true for 1T FBCs using GIDL-current charging, for which the shorter $L_{eff}$ will tend to limit $L_g$ scalability.

The FBGC is made possible by the 2T structure, in which writing and reading data are done via two separate bit lines, as opposed to the less flexible 1T FBC. The four-terminal 2T FBGC, with the gate of T1 still serving as the word line, further allows more design flexibility for optimizing overall performance.

Figure 7:
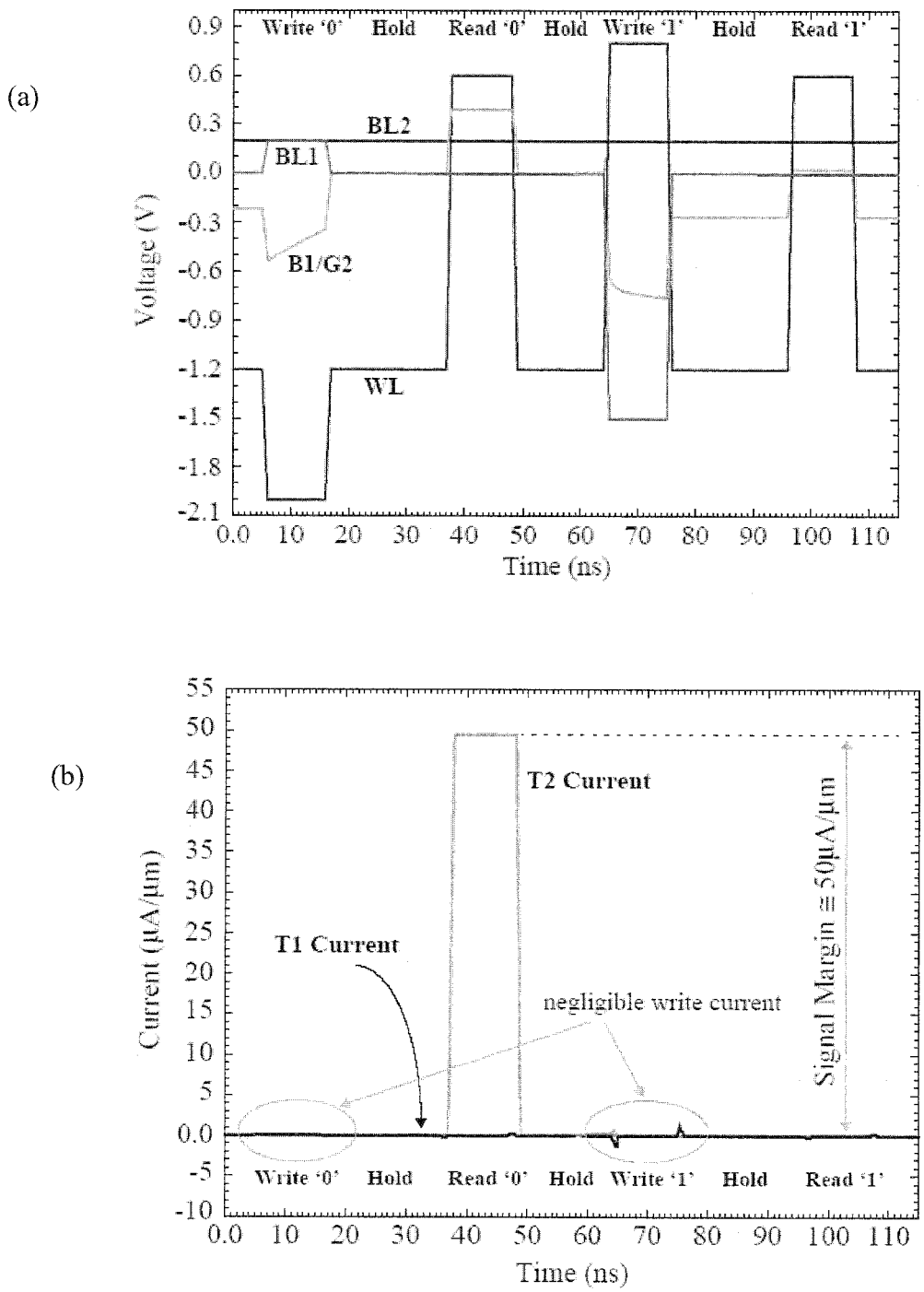
FIG. 7 shows a transient sequential operation of a memory cell of the embodiment shown in FIG. 6, predicted by a 2-D mixed-mode numerical simulation using Taurus.

The operation of the 2T FBGC can be verified and demonstrated by numerical simulations using Taurus. The 2-D structural domain used is similar to that in FIG. 5, with 28 nm FD/SOI transistors. The predicted results for a sequential memory operation, with T2 current used for sensing data, are shown in FIG. 7, including the floating-B1/G2 voltage transient (i.e., $V_{BS}(t)$ of T1). In particular, FIG. 7 shows transient sequential memory operation of an FBGC according to an embodiment depicted in FIG. 6 predicted by a 2-D mixed-mode numerical simulation using Taurus with a structural domain similar to that in FIG. 5, with 28 nm FD/SOI transistors. The applied WL and BL1 voltage pulses, for GIDL-current charging, are shown in (a), along with the predicted floating-B1/G2 voltage transient and the BL2 voltage ($V_{DS2}$) set to 0.2 V. The T2 current in (b) reflects the basic memory operation, showing a current margin of about 50 μA/μm. The T1 current in (b) reflects the negligible power dissipation during the B1 discharging (write '1') as well as charging (write '0'). The results confirm the basic operation of the FBGC cell based on GIDL-current charging of T1, showing an outstanding signal margin that is about 2.5× higher than that achieved in a 1T FBC counterpart described in "A capacitorless 1T-DRAM technology using gate-induced drain-leakage (GIDL) current for low-power and high-embedded memory," by E. Yoshida and T. Tanaka, *IEEE Trans. Electron Devices*, vol. 53, pp. 692-697, April 2006 with the same drain bias. Referring to FIG. 7, it can be seen that the negligible write-power dissipation reflected by the transient current in T1 is void of any channel current. The B1-discharging current is about four orders-of-magnitude lower than what is typical in 1T FBCs. The charging/discharging-current comparison of the FBGC versus the 1T FBCs described in "A capacitor-less 1T-DRAM cell," by Okhonin et al., *IEEE Electron Device Lett.*, vol. 23, pp. 85-87, February 2002 (referred to as [2]) and "A capacitorless 1T-DRAM technology using gate-induced drain-leakage (GIDL) current for low-power and high-embedded memory" (April 2006) (referred to as [6]) are shown in Table 1. The results in Table 1 clearly reflect the superiority of the FBGC with regard to power consumption.

TABLE 1

| Current (A/μm) | FBGC | [2] | [6] |
| --- | --- | --- | --- |
| Charging | $1.3 \times 10^{-8}$ | $4.0 \times 10^{-5}$ | $1.5 \times 10^{-8}$ |
| Discharging | $1.2 \times 10^{-7}$ | $8.0 \times 10^{-4}$ | $>1 \times 10^{-3}$ |

Figure 21:
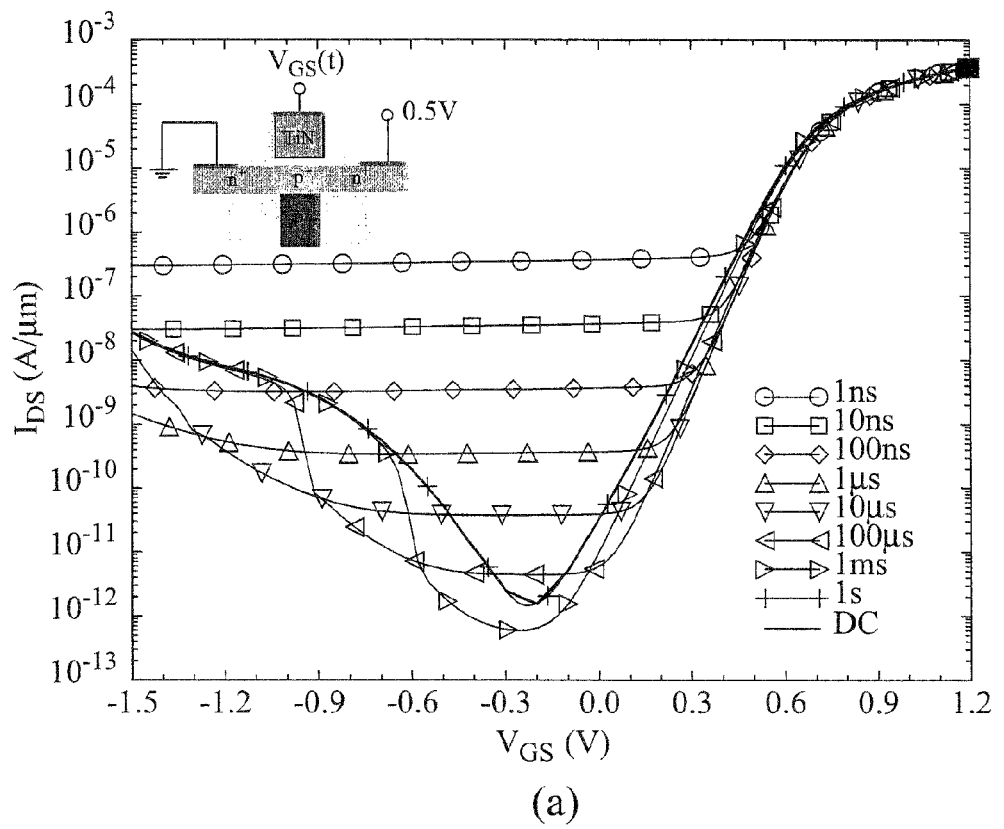
FIG. 21 shows a plot of (a) drain current-gate voltage characteristics of T1 in the FBGC of FIG. 6, without T2 tied to B1, for varying $V_{GS}$ sweep times and (b) corresponding hole-density distributions across the body.
Figure 21:
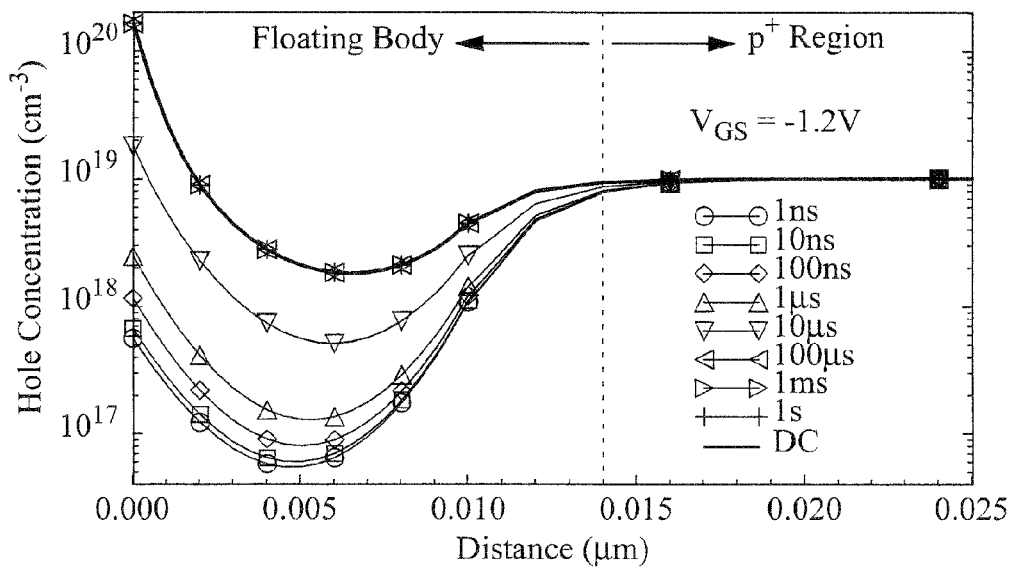

The write-'0' (B1-charging) process via GIDL current is enabled by a fast, non-quasi-static (NQS) redistribution of holes in the floating B1-G2 connect, which quickly establishes the accumulation condition in T1 needed for the gate-controlled band-band tunneling of electrons to the drain/source. Such a NQS effect, which occurs in any FBC using GIDL, has not been previously acknowledged. It means that the fast-transient GIDL charging current differs from the DC GIDL current. FIG. 21 shows additional numerical simulation results. Referring to FIG. 21, predicted drain current-gate voltage characteristics of T1 in the FBGC of FIG. 6, without T2 tied to B1, for varying $V_{GS}$ sweep times are shown, along with corresponding hole-density distributions across the body. The NQS effect is reflected, revealing that fast-transient GIDL current flows, but is less than the DC GIDL current. Accordingly, it is not a reliable metric for FBC design, e.g., for defining the crucial WL and BL voltage pulses.

Figure 8:
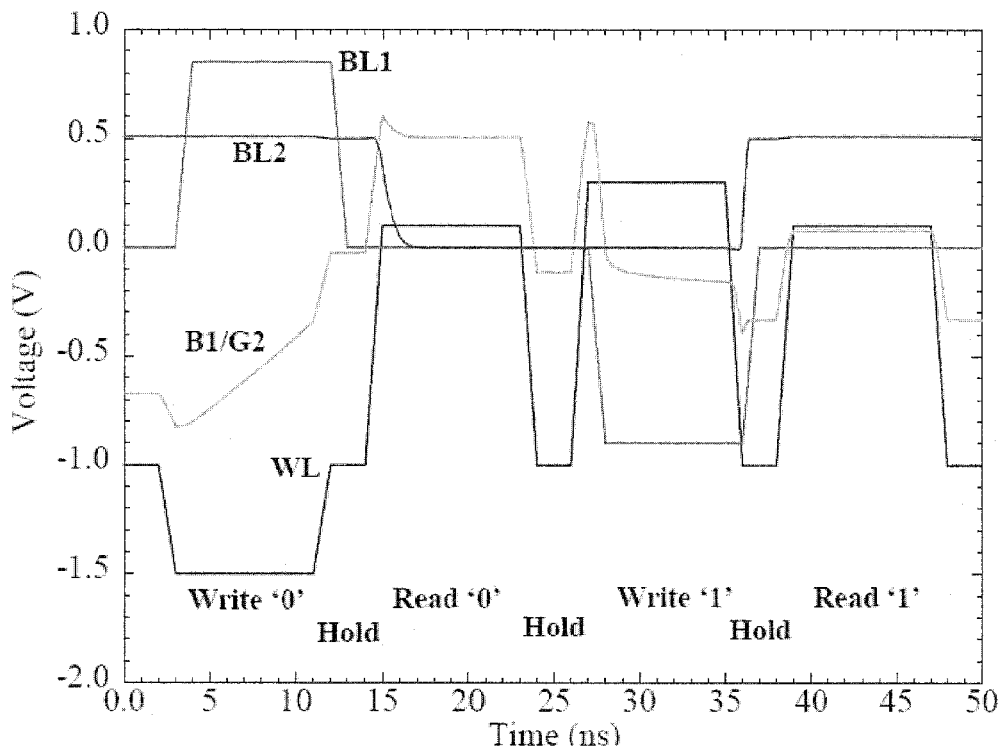
FIG. 8 shows a transient sequential memory operation of a memory cell according to the embodiment shown in FIG. 6, predicted by UFDG/Spice3.

The 2T FBGC can also enable data sensing via the BL2 voltage, for which $V_{B1/G2}(t)$ should be able to swing through $V_t$ of T2 and the stored charge in B1 should be high enough to image an adequate inversion charge in T2. The latter requirement is dependent on the noted NQS effect, which enables the oxide capacitance of T1, as well as the gate capacitance of T2, to augment $C_{Bi}$ of (1) in the body of T1. Simulations using UFDG in Spice3 are provided to demonstrate this operation with realistic FinFETs, and to check the data retention/disturb characteristics with reasonable computational efficiency. In the simulations, although UFDG is a quasi-static model, the NQS effect has been accounted for in the GIDL-current modeling. The simulations assume undoped 28 nm single-fin DG nFinFETs (or ITFETs) with a midgap gate. To avoid significant gate tunneling current, as well as reduce parasitic gate-source/drain capacitance, which is very important in T2, a pragmatic gate oxide of 2 nm is assumed; the fin width is set to 14 nm for SCE control. A 1.5 nm G-S/D overlap in T1 is assumed for reasonable GIDL current, and a 3 nm underlap in T2 is used to further reduce the parasitic (fringe) capacitance. Such 2T-FBGC design is doable using, for example, the previously noted ITFET structure. The predicted operation is shown in FIG. 8. FIG. 8 shows UFDG/Spice3-predicted transient sequential memory operation of a 2T FBGC designed with undoped 28 nm DG single-fin nFinFETs with height and width of 56 nm and 14 nm, respectively, and 2 nm gate oxide; T2 is designed with 3 nm G-S/D underlap, whereas T1 has 1.5 nm overlap to enable GIDL-current charging. The applied WL and BL1 voltage pulses are shown, along with the predicted floating B1/G2 and BL2 voltage transients; the BL2 capacitance was assumed to be 20 fF. The WL and BL1 voltage-pulse amplitudes are given in Table 2 below. The voltage sensing, via BL2 with a 0.5 V precharge, shows a solid signal margin with fast (<10 ns) write/read times.

TABLE 2

| Node | Write '0' | Write '1' | Read | Hold |
|---|---|---|---|---|
| WL | −1.5 V | 0.3 V | 0.1 V | −1.0 V |
| BL1 | 0.85 V | −0.9 V | 0 V | 0 V |

The quasi-optimal WL and BL1 voltage pulses are given above in Table 2. The operation here is more efficient than that shown in FIG. 7 mainly because of the upgraded T2 design. Note that, with BL2 precharged to 0.5 V, the fast BL2 voltage transient, going to 0V or 0.5 V, faithfully reflects the stored data directly in this case. This solid voltage-signal margin implies higher FBGC memory density, since wide (e.g., multi-fin) devices generally must be used in the 1T cell for adequate current margin.

Figure 9:
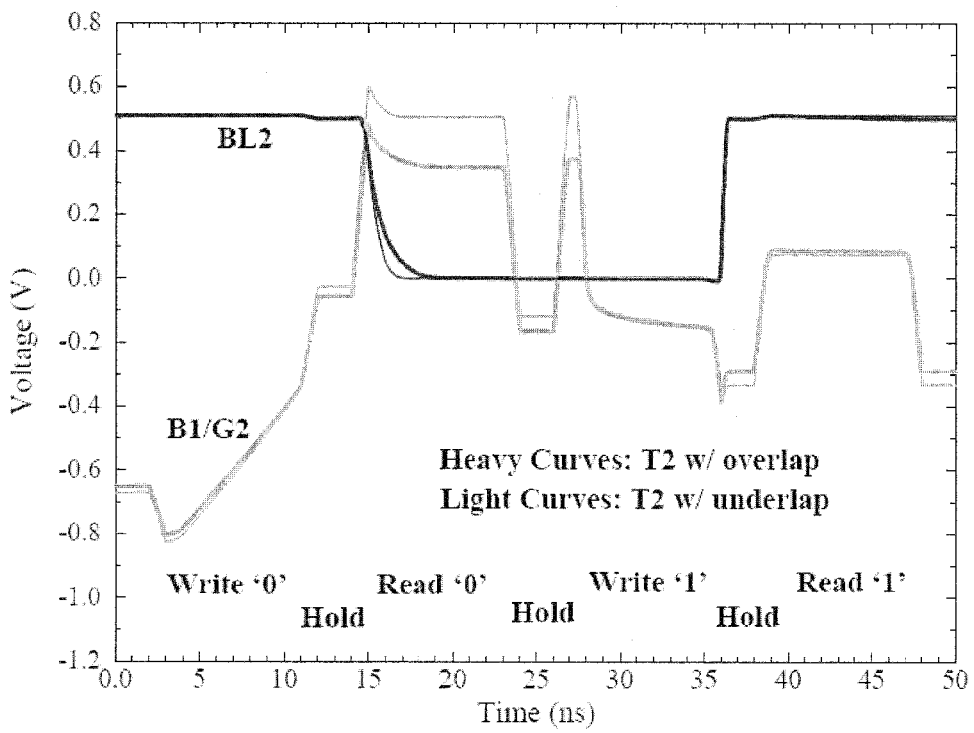
FIG. 9 shows a transient sequential memory operation of another memory cell according to the embodiment shown in FIG. 6, predicted by UFDG/Spice3.

To demonstrate the benefit of the noted T2-design upgrade, the FBGC operation is simulated again, but with T2 identical to T1. In this case, T2, with the G-S/D overlap, has much higher parasitic capacitance, including increased G-S/D fringe capacitance as well as the added overlap capacitance. The UFDG/Spice3-predicted B1/G2 and BL2 voltage transients are contrasted in FIG. 9 with those of FIG. 8. FIG. 9 shows UFDG/Spice3-predicted transient sequential memory operation of the 2T FBGC of FIG. 8, but with T2 identical to T1, with G-S/D overlap.

Although now the added parasitic capacitance of T2 must be charged during the write-'1' process, the larger oxide capacitance of T1, where the predominant $\Delta Q_p$ is stored, still controls the $V_{B1/G2}$ charging (write '0') transient. However, the subsequent read-'0' efficacy is clearly undermined. The WL pulse does not bring $V_{B1/G2}$ up as much or as fast because of the added parasitic capacitance of T2, thereby portending slower read time and shorter retention time (as well as reduced margin for current sensing).

Figure 10:
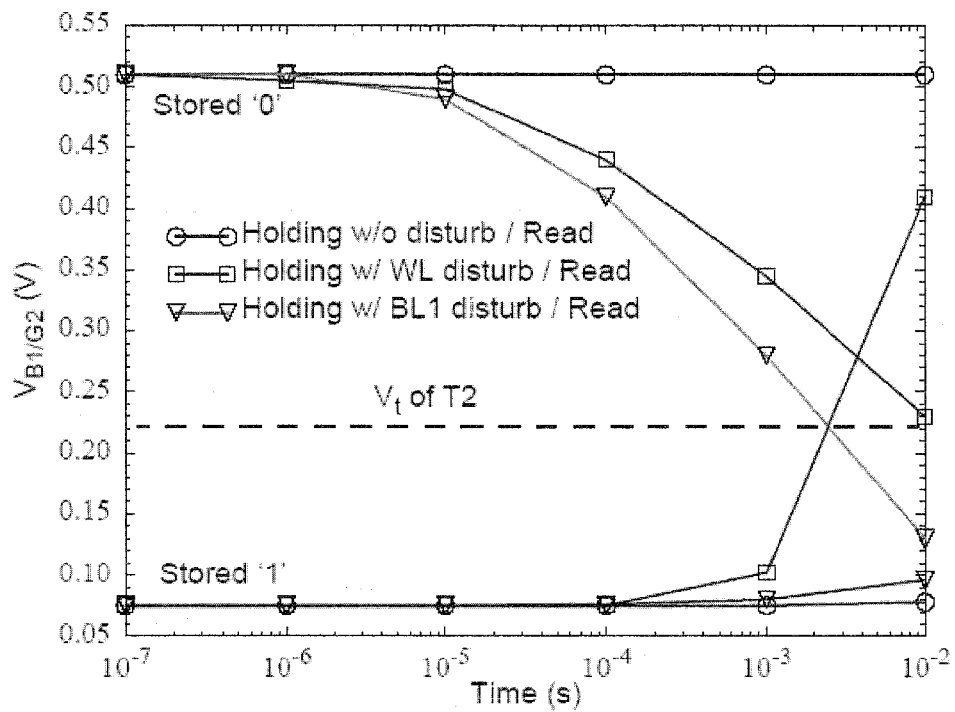
FIG. 10 shows a plot indicating worst-case data retention/disturb characteristics of a memory cell according to an embodiment of the present invention predicted using UFDG/Spice3.
Figure 11:
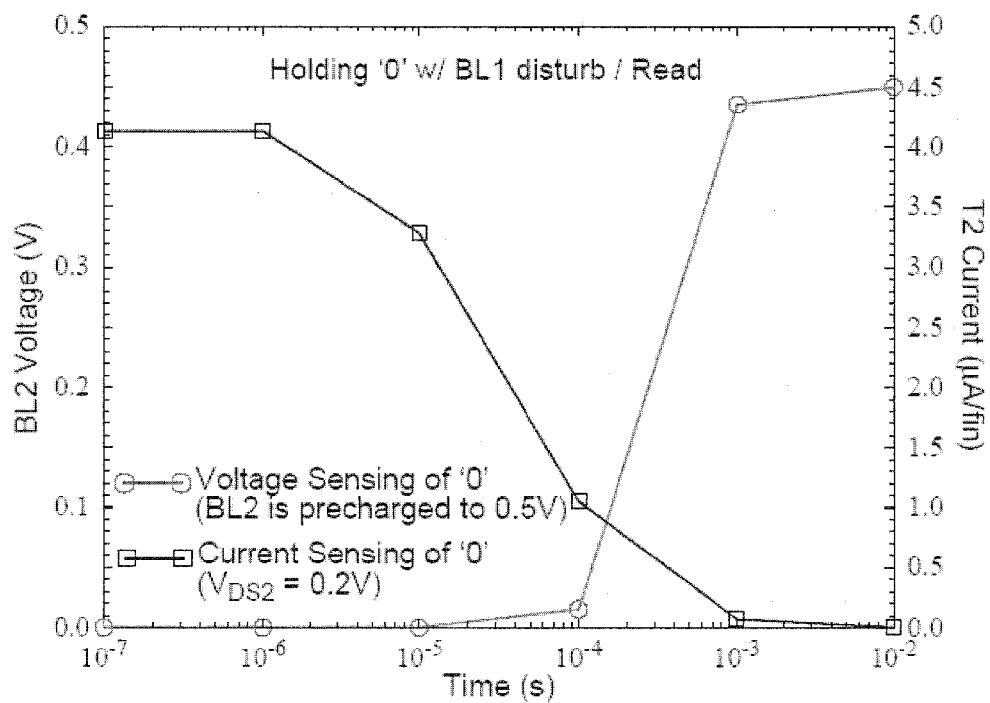
FIG. 11 shows a plot indicating voltage sensing and current sensing of a memory cell according to an embodiment of the present invention (FBGC shown in FIG. 6) predicted using UFDG/Spice3.

The data retention/disturb characteristics of the 2T FBGC, governed by GIDL and $I_R$ currents in T1, are better than those of the counterpart 1T FBC due to the undoped body, and can be improved by design optimization enabled by the 2T structure. Also, when GIDL current is used for charging, the gate capacitance of T1 augments $C_{Bi}$ in equation (1), tending to increase the stored-'0' charge and lengthen the retention time. For the FBGC of FIG. 8, UFDG/Spice3 predictions of read-$V_{B1/G2}$(t) resulting from worst-case, long-time WL and BL1 disturbs are shown in FIG. 10. In particular, FIG. 10 shows worst-case data retention/disturb characteristics of the 2T FBGC in FIG. 8 reflected by UFDG/Spice3 predictions of the read-B1/G2 voltage after lengthy data ('0' and '1') holds subject to continuous WL and BL1 disturbs. The WL and BL1 disturbs are those that undermine the data storage, as given in Table 2. The T2 threshold voltage is superimposed to indicate retention times. The undermining hold-'1' (with B1 discharged) disturbs result in GIDL-current charging of B1, and the undermining hold-'0' (with B1 charged) disturbs result in drain/source-junction $I_R$ discharging of B1. The retention times are implied by $V_{B1/G2}$(t) relative to $V_t$ of T2, which is indicated in the figure. This $V_t$ can be tailored to optimize the tradeoff between data-retention times and read/write performance. FIG. 11 shows UFDG/Spice3-predicted BL2 read-voltage and T2 read-current (with $V_{DS2}$=0.2 V applied) of the 2T FBGC in FIG. 8 after lengthy '0' (B1 charged) holds subject to the continuous BL1 disturb (−0.9 V) in FIG. 10. Note that a much longer worst-case retention time (~1 ms) is yielded by the voltage sensing.

To exemplify the retention time directly, FIG. 11 shows the sensed BL2 voltage versus time corresponding to the BL1 hold-'0' disturb; a worst-case retention time of ~1 ms is predicted, much longer than the 100 μs described in "A capacitorless 1T-DRAM technology using gate-induced drain-leakage (GIDL) current for low-power and high-embedded memory" (April 2006). Also in FIG. 11, sensed T2 current versus time is shown corresponding to the same disturb, giving insight regarding data retention for voltage versus current sensing. Note the dramatic increase in the retention time afforded by (one-fin) voltage sensing versus current sensing; the latter time is about an order-of magnitude shorter, exemplifying why multi-fin devices are generally needed in this case.

In the FBGC, the source and drain of one transistor (T1) are tied together and to BL1, meaning there is no source-drain (e.g., channel) current. Since T1 does not function as a transistor in the FBGC, GIDL current must be used for body charging, which can be advantageous. In a specific embodiment, the fabrication process of a two transistor floating body dynamic memory cell can be simplified. In an embodiment for fabricating a FBGC in which the body (B1) of T1 is tied to the gate (G2) of the second transistor (T2), the source region of the first transistor T1 can be implanted at high concentration with impurities of the same conductive type as the body B1 of T1. For example, the source region of T1 can be made B1 instead of n+, thereby creating a direct way of connecting a p-type body B1 of T1 to the gate G2 of T2 without requiring additional layout area.

Figure 12:
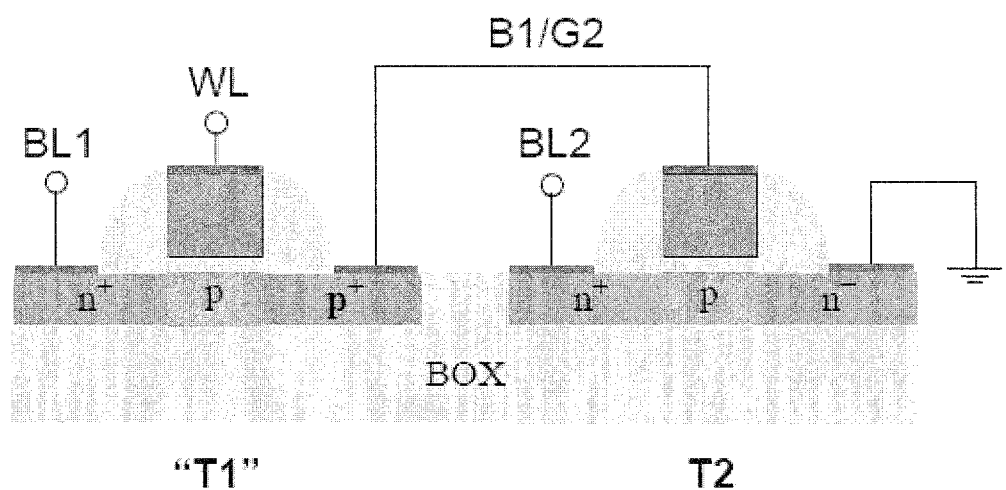
FIG. 12 shows a conceptual layout of a memory cell according to an embodiment of the present invention.

This conceptual layout is shown in FIG. 12. Referring to FIG. 12, only the drain of T1 is tied to BL1, while the body of T1 can be tied to the gate G2 of T2 through the source region of T1. Here, T1 is now a gated diode. The p+"source" enables an easy, direct connection of the T1 body to the gate of the T2 MOSFET as shown in the figure. The cell can thus be easily processed in any SOI technology, using planar or quasi-planar (e.g., FinFET) devices (or in bulk Si with T1 in polysilicon).

In embodiments using p-channel transistors, the source region of T1 can be made n+ instead of p+, thereby facilitating tying of the n-type body of T1 (B1) to the gate of T2 (G2). Cell performance can also be improved because of the additional WL-B1 capacitive coupling. Of course, these types of modifications change T1 from a transistor to a simpler device. According to embodiments of the modified FBGC, the alignment of the gate and source region of T1 is not critical, which also serves to simplify fabrication.

According to the modified FBGC embodiment, GIDL, or BBT current in T1, controlled by the word line (WL=G1) and the programming bit line (BL1=D1), can be used to charge the floating body/gate (B1/G2) (write a '1'). A forward bias on the diode, defined by BL1 and the B1/G2 voltage (VB1/G2), can be used to discharge B1/G2 (write a '0'). For current sensing on the read hit line (BL2), the BL2 voltage can be high for increased margin, unlike in 1T cells subject to read disturbs. In addition to easing the manufacturing of the FBGC, the p+ "source" enhances the transient G1-B1 coupling via the fringe/overlap G1-"S1" capacitance.

In one example embodiment, the modified FBCG can be fabricated using nFinFETs where the source region of T1 is made p+ instead of n+ and the gate of T2 is tied to the body of T1 through the p+ region of T1.

Figure 14:
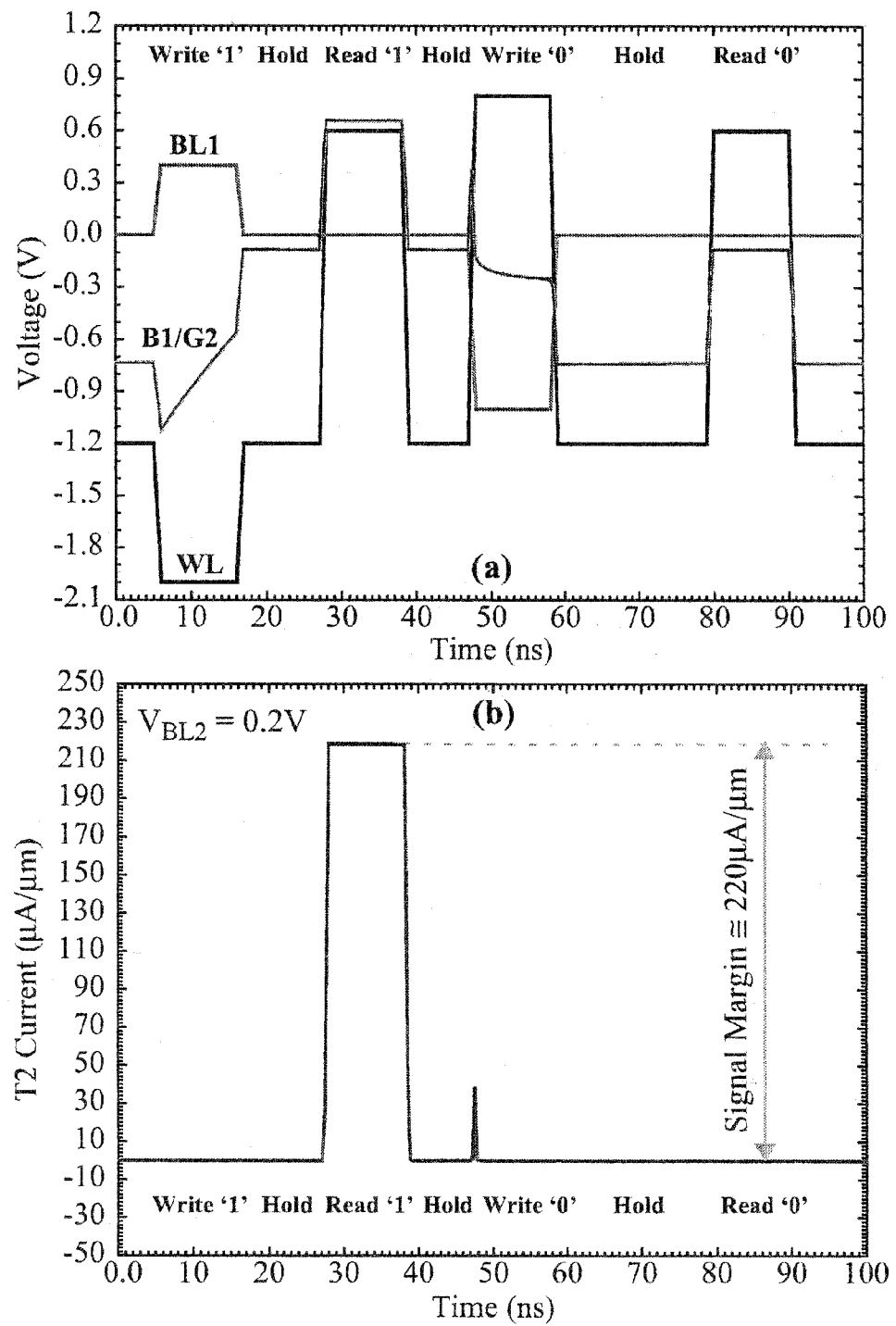
FIG. 14. shows a transient sequential memory operation of the embodiment shown in FIG. 12, predicted by a 2-D mixed-mode numerical simulation using Taurus.

The operation of the modified FBGC can be verified and demonstrated by numerical simulations using Taurus. The 2-D structural domain used for the (mixed-mode) simulation is similar to that shown in FIG. 12, with 28 nm gate length FD/SOI nMOSFET structures ($t_{ox}$=2 nm, $t_{Si}$=14 nm, $t_{box}$=50 nm) and T1 being a gated diode. The thin bodies are considered undoped, the gates are TiN (midgap work function), and the p+ "S1" is tied directly to G2. The assumed Gaussian source/drain lateral doping profile defines a 2 nm G-S/D overlap in both devices; the T2 threshold voltage (Vt) is about 0.2 V. Predicted results for a transient sequential memory operation are shown in FIG. 14, including the floating-B1/G2 voltage transient. The applied WL and BL1 voltage pulses, for GIDL charging, are shown in FIG. 14 (a), along with the predicted floating-B1/G2 voltage transient. The T2 current in FIG. 14 (b) reflects the basic memory operation, showing a current margin of 220 μA/μm. The results, with ns-scale write times, demonstrate the basic operation of the cell, showing that the floating body of T1 effectively drives the gate of T2 and yields outstanding signal margin. The predicted T2 current margin (220 mA/mm for VBL2=0.2 V) is more than 4×-larger than that predicted for the embodiment shown in FIG. 5 (see FIG. 7), and more than 10×-larger than that predicted for the 1T-FBC counterpart described in "A capacitorless 1T-DRAM technology using gate-induced drain-leakage (GIDL) current for low-power and high-embedded memory," by E. Yoshida and T. Tanaka. The dramatic increase in the margin can be attributed to the added WL-B1 capacitive coupling mentioned above, which is especially significant at times when the intrinsic gate capacitance is small during the transient operation of the cell. It results in a larger read '1'-read '0' margin for VB1/G2, which can be optimally positioned relative to Vt of T2.

Predicted results from FIG. 14 for the modified FBGC and FIG. 7 for the original FBGC are contrasted in Table 3.

TABLE 3

| FBGC | Margin ($V_{BL2}$ = 0.2 V) | $V_{B1/G2}$ (read '1') | $V_{B1G2}$ (read '0') |
|---|---|---|---|
| modified FBGC (FIG. 14) | 220 μA/μm | 0.67 V | −0.09 V |
| FBGC (FIG. 7) | 50 μA/μm | 0.39 V | 0.02 V |

The high margin, which can be even higher as noted, implies high effective density (margin per area) for the modified FBGC. Further, the predicted write power is negligible since there is no T1 channel current, unlike in the 1T DRAM cells.

Figure 13:
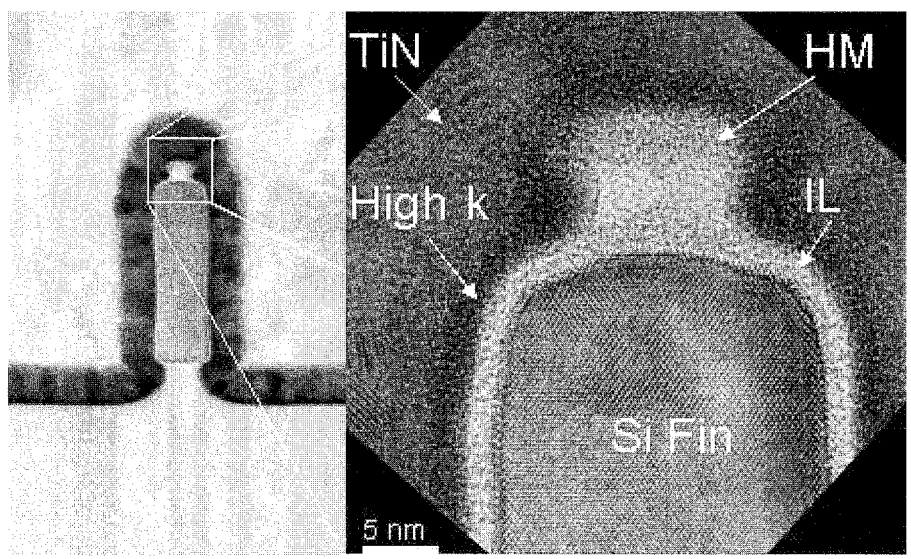
FIG. 13 shows a cross-sectional TEM image of the FinFET structure used for both T1 (gated diode) and T2 (standard diffused DG transistor) of an embodiment of the present invention (FBGC shown in FIG. 12).
Figure 15:
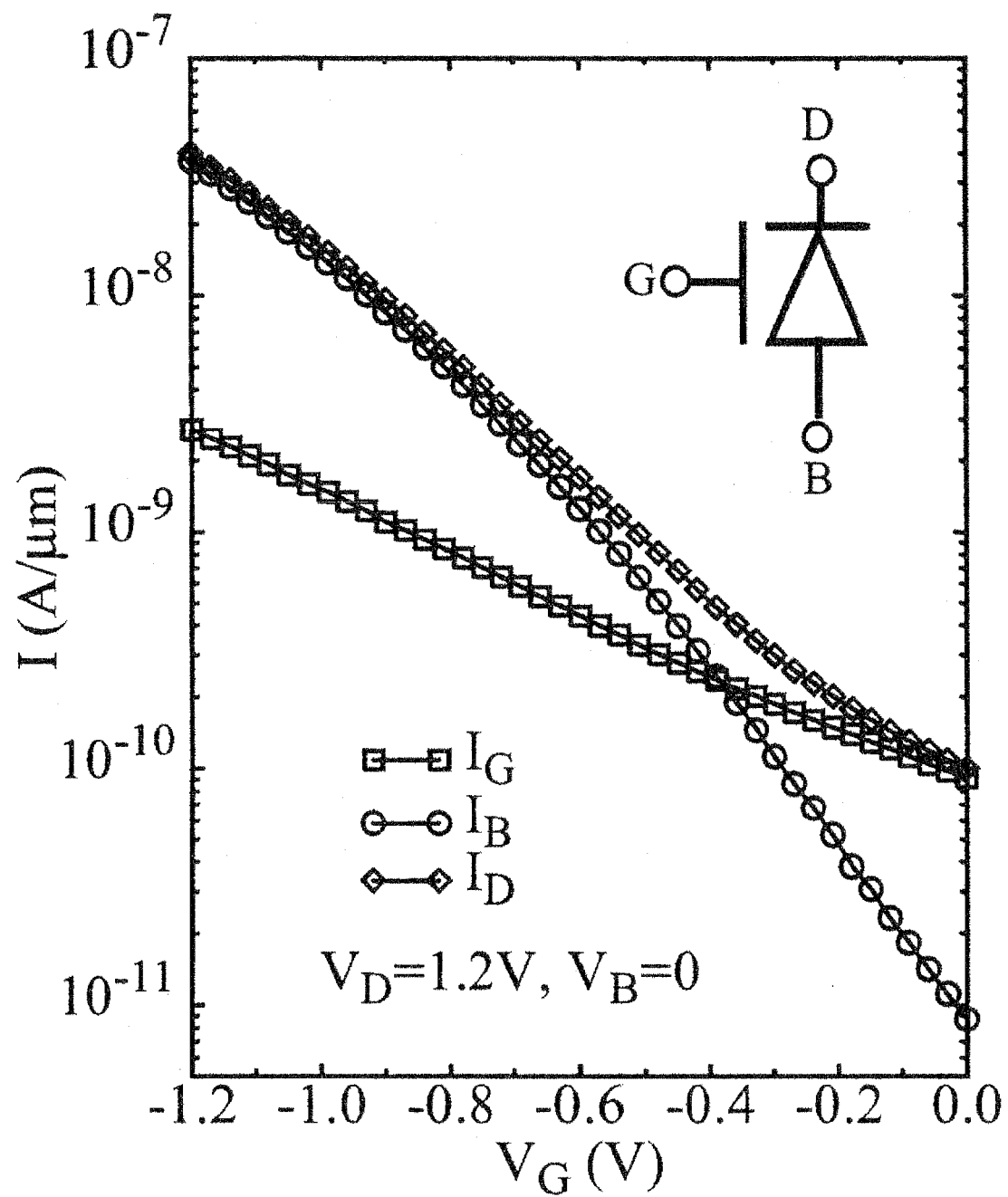
FIG. 15 shows a plot of current-voltage characteristics (per twice fin height) of the p+p-n+ gated diode formed from a double-gate nFinFET structure with a p+ "source" (S=B), where Lg=500 nm, EOT≅1.3 nm, and $t_{Si}$≅20 nm, in accordance with an embodiment of the present invention. The body current (IB) is the GIDL current.
Figure 16:
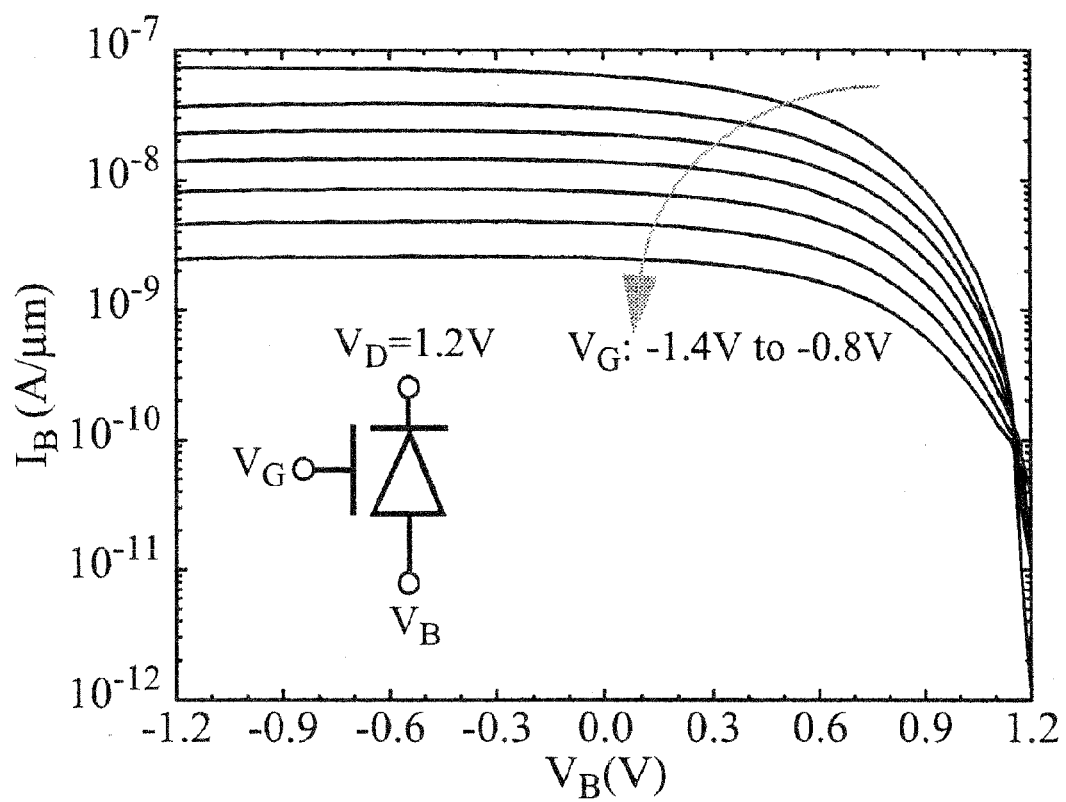
FIG. 16 shows a plot of dependence of the GIDL current on the body, or junction voltage, in accordance with an embodiment of the present invention.
Figure 17:
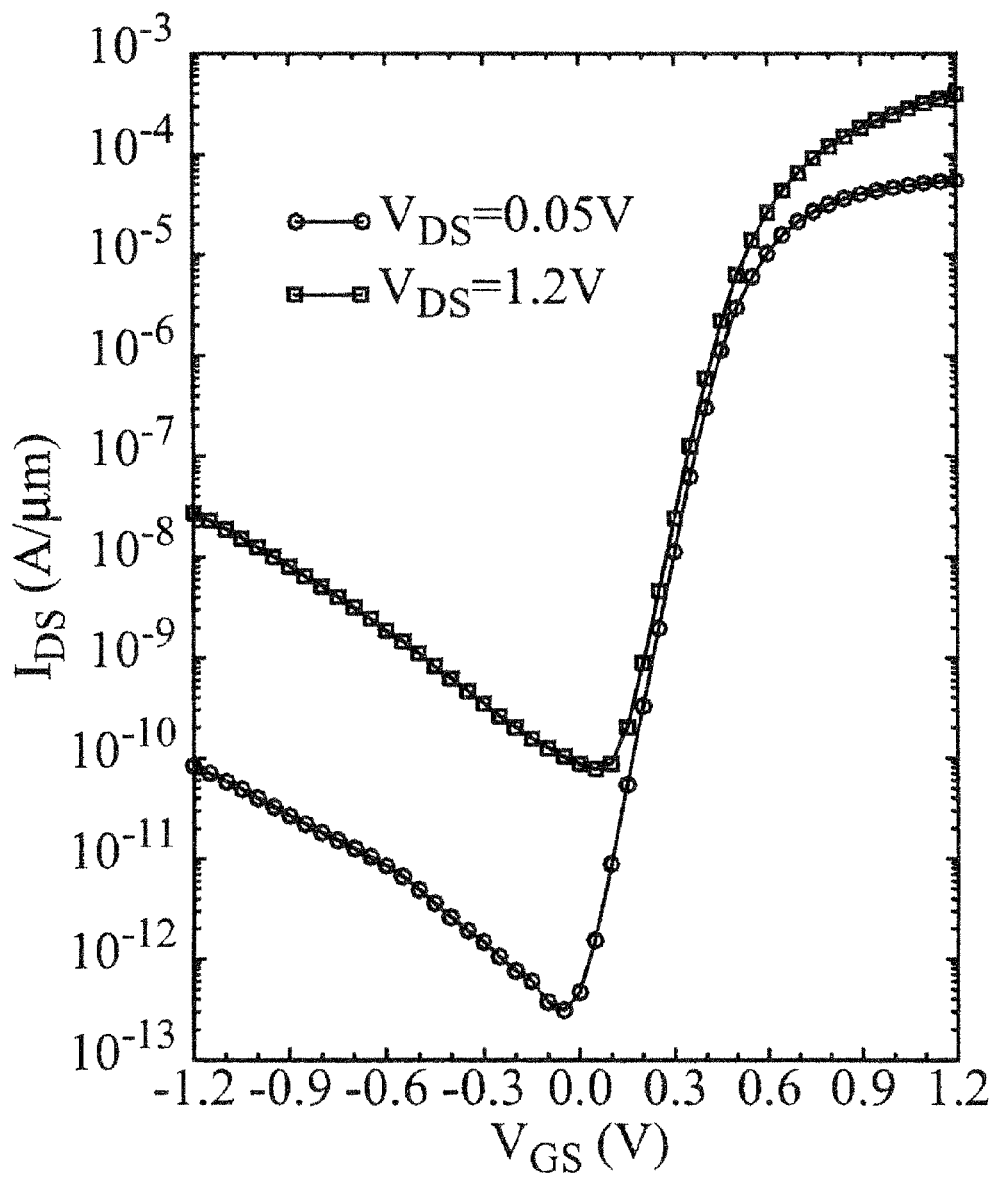
FIG. 17 shows a plot of measured current-voltage characteristics (per twice fin height) of the double-gate nFinFET, where Lg=120 nm, EOT≅1.3 nm, and $t_{Si}$≅20 nm, in accordance with an embodiment of the present invention.
Figure 18:
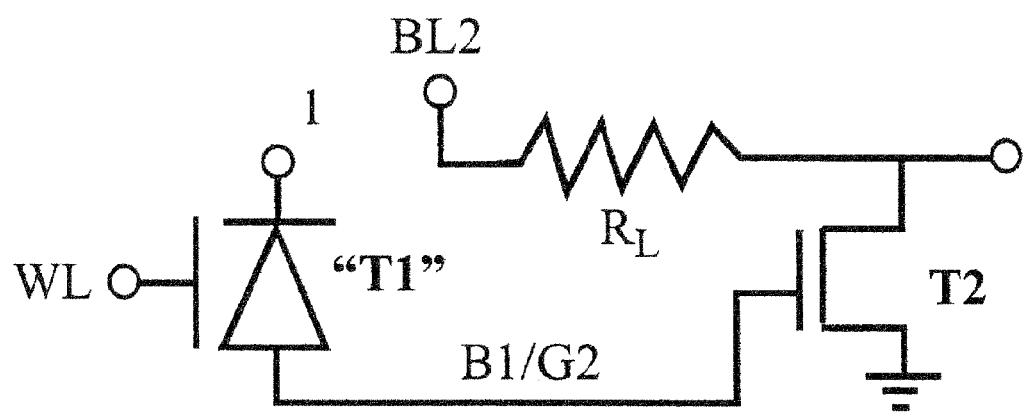
FIG. 18 shows a schematic of a modified FBGC (shown in FIG. 12) in accordance with an embodiment of the present invention.
Figure 19:
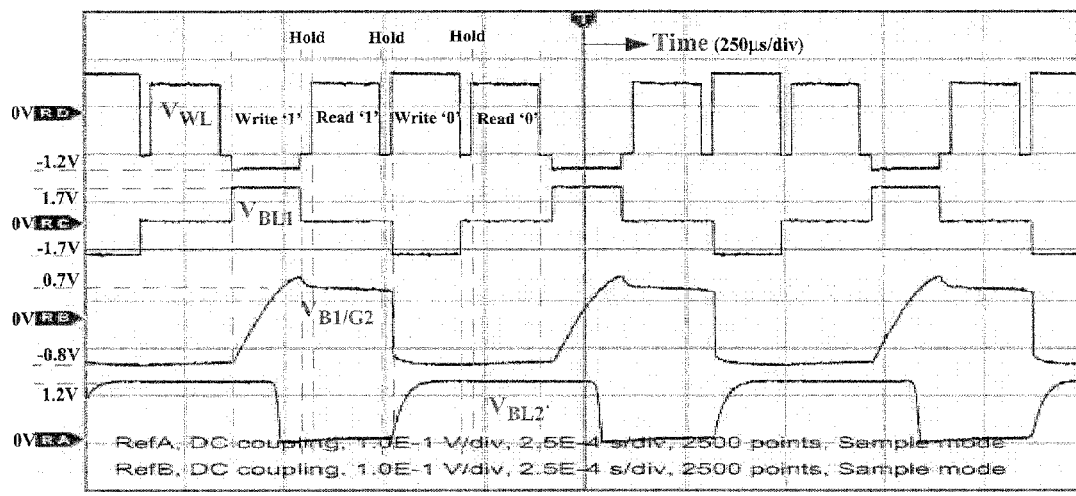
FIG. 19 shows measured transient sequential write/hold/read operations for '1' and '0' of a memory cell according to an embodiment of the present invention (modified FBGC schematic shown in FIG. 18).

An example of the modified FBGC was fabricated according to one implementation. In particular, double-gate nFinFETs and gated-fin diodes were fabricated at SEMATECH. According to this example, the devices have undoped, 20 nm fin-bodies, TiN gates, and Hf-based high-k dielectric with EOT=1.3 nm. A TEM cross-section of the gate-on-fin structure used for both devices is shown in FIG. 13. The fin dimensions are 20 nm wide by 80 nm tall. The inset shows a high-resolution TEM of the gate stack showing the scaled Hf-based dielectric with ALD TiN metal. The FinFET gate length (Lg) is 120 nm, and that for the p+p-n+ gated diode is 500 nm. Measured current-voltage characteristics of the gated diode are shown in FIG. 15. In particular, FIG. 15 shows the GIDL current, and the much smaller (even with the long Lg) gate tunneling current. The measured dependence of IBBT on the body voltage, which can be important for optimal FBGC design, is shown in FIG. 16. Measured current-voltage characteristics of the FinFET are shown in FIG. 17. FIGS. 16 and 17 show a high Vt of almost 0.5V (as for long Lg as described in "Threshold voltage and bulk inversion effects in nonclassical CMOS devices with undoped ultra-thin bodies," by V. P. Trivedi, et al., *Solid-State Electron.*, vol. 51, p. 170, January 2007). The test chip used to provide the results of FIGS. 15-17 does not contain an integrated FBGC, so the memory function is demonstrated using a prototype created by hard-wiring B1 of a gated diode to G2 of a FinFET at a probe station. Accordingly, a schematic of the prototype is shown in FIG. 18. The demonstration is thus based on slow transient measurements because of stray capacitance. Measured results of sequential write/hold/read operations for '1' and '0', which correspond to FIG. 14, are shown in FIG. 19. In particular, FIG. 19 shows measured transient sequential write/hold/read operations for '1' and '0' of a memory cell according to an embodiment of the present invention as shown in the schematic of FIG. 18. Referring to FIG. 18, the modified FBGC includes the gated diode and the FinFET (described with respect to FIGS. 15-17).

Figure 20:
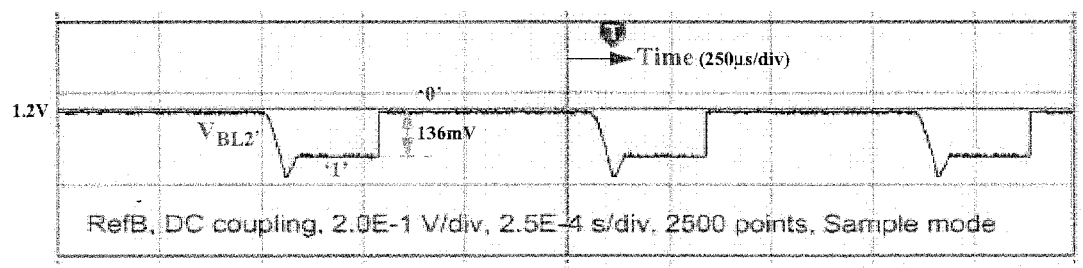
FIG. 20 shows measured transient sequential write/hold/read operations for '1' and '0' of a memory cell according to an embodiment of the present invention (modified FBGC schematic shown in FIG. 18).

Referring to FIG. 19, the voltage-based sensing option (with inverse logic) is clearly demonstrated via $V_{BL2}$, with high RL=100KO. The stray capacitance of the external B1-G2 wire underlies the abnormally slow transients. The T2 drain (~BL2) voltage transient indicates the stored data with a solid margin set by the supply voltage. Such voltage sensing may be the preferred option for the modified FBGC because of longer retention times and lower power, as well as less sophisticated sensing circuitry. FIG. 20 shows measured results of a current-sensing operation of the modified FBGC prototype. Here, a higher bit-line voltage ($V_{BL2}$) is used for high margin, enabled by the 2T cell as noted above. The FD body of T2 inhibits any read-induced Vt shifts, e.g., due to impact ionization-current charging. The results in FIG. 20 show a very high signal margin of 340 mA/mm, even with the high Vt. This is a record current margin, even higher than that reported for the BJT-based FBC described in "New Generation of Z-RAM" by S. Okhonin, et al., *IEDM Tech. Dig.*, p. 925, December 2007.

Accordingly, embodiments of a 2T floating-body cell for embedded-DRAM on SOI and on bulk silicon are provided. The operation of certain specific embodiments was demonstrated and verified via process/physics-based device/circuit simulations and supported by numerical simulations. The use of the floating body of one transistor (T1) to directly drive the gate of the second transistor (T2) provides dramatic improvement in signal margin while allowing voltage sensing. A modification of the basic 2T-FBC structure is also provided, enabled by using GIDL current for T1-body charging, in which the source and drain of T1 are tied together to than the programming bit line (BL1). Embodiments of the FBGC, which is virtually a floating-body/gate cell, can effectively eliminate the write (T1 charging and discharging)-power dissipation, while yielding better signal margin, longer data retention via voltage sensing, and higher memory density. A further modification of the FBGC makes the source region of T1 a highly doped region of the same conductive type as the body of T1, such that the tying of the body of T1 to the gate of T2 in the fabrication process is facilitated.

The simulation-based demonstration of the FBGC and modified FBGC was based on undoped nanoscale DG Fin-FETs, or IGFETs, which, in an embodiment, can be scaled to $L_g$<10 nm. Accordingly, an embodiment FBGC DRAM implemented with such FETs is similarly scalable, and much more so than a 1T counterpart for which the gate-source/drain overlap ($L_{eff}$<$L_g$) needed for GIDL current will limit its scalability. Scaling $L_g$ will tend to reduce the effective storage capacitance of the 2T cell, i.e., the oxide and gate capacitances of T1 and T2 that augment the right-hand side of equation (1) for T1. Thus, for a specified T1-charging time, less $\Delta Q_p$ will be stored, although the signal margin will not be undermined. In an embodiment, the device scaling will include scaling $t_{Si}$, which means that the S/D-junction $I_R$ and $I_G$ will be reduced. Further, because of the design flexibility afforded by the 2T FBGC, the GIDL current can be controlled via optimal design of the G-S/D overlap in T1, with T2 being designed optimally as discussed herein. Hence, the FBGC data retention time can be sustained, and the new memory technology can be scaled along with the FinFET CMOS technology.

Furthermore, with respect to the modified FBGC, the undisturbed data retention times of the nanoscale FBGC are predicted to be very long (>1s) due to the undoped body of T1, which implies long carrier lifetimes. The retention times under WL and BL1 disturbs are the critical ones; they are defined by GIDL (IBBT) and recombination (IR) currents in T1, like in previously described 1T cells (but with IR halved due to the p+ "source"). The '1' retention time with BL1 disturb is adequate because of the ultra-thin $t_{Si}$, and thus low IR. According to an embodiment, the worst-case '0' retention time with WL disturb can be lengthened by limiting IBBT via control of $V_{B1/G2}$ in the hold state, as implied by FIG. 16. Table 4 projects this retention time for the FBGC of FIG. 14 based on the time measured in "A capacitorless 1T-DRAM technology using gate-induced drain-leakage (GIDL) current for low-power and high-embedded memory," by E. Yoshida and T. Tanaka, the FIG. 16 measurement with acknowledgment of the NQS effect on the VB dependence, and the B1/G2 hold-charging equation $I_{BBT}t_{ret} \cong C_{B1G2} \Delta V_{B1G2}^{crit}$.

TABLE 4

| BL1 (hold) | WL ('1' disturb) | $V_{B1G2}$ (@ hold '0') | $t_{ret}$ |
|---|---|---|---|
| 0 V | −0.2 V | −0.72 (FIG. 1) | 25 μs |
| 0 V | −0.2 V | −0.5 V | 42 μs |
| 0 V | −0.2 V | −0.2 V | 240 μs |
| 0 V | −0.2 V | −0.1 V | 420 μs |

In particular, Table 4 shows an estimation of worst-case '0' retention time (300K) for the FBGC of FIG. 14, based on the 10 μs time of Yoshida and Tanaka, the FIG. 14 measurement with acknowledgment of the related NQS effect, and the B1/G2 hold-charging equation. Note that $C_{B1G2}$ is about 2× that of the 1T-cell counterpart.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

REFERENCES

1. K. Kim, C.-G. Hwang, and J. G. Lee, "DRAM technology perspective for gigabit era," *IEEE Trans. Electron Devices*, vol. 45, pp. 598-608, March 1998.
2. S. Okhonin, M. Nagoga, J. M. Sallese, and P. Fazan, "A capacitor-less 1T-DRAM cell," *IEEE Electron Device Lett.*, vol. 23, pp. 85-87, February 2002.
3. R. Ranica, et al., "A capacitor-less DRAM cell on 75 nm gate length, 16 nm thin fully depleted SOI device for high density embedded memories," *IEDM Tech. Dig.*, pp. 277-280, December 2004.
4. E. Yoshida, T. Miyashita, and T. Tanaka, "A study of highly scalable DG-FinDRAM," *IEEE Electron Device Lett.*, vol. 26, pp. 655-657, September 2005.
5. M. Nagoga, et al., "Retention characteristics of zero-capacitor RAM (Z-RAM) cell based on FinFET and tri-gate devices," *Proc. IEEE Internat. SOI Conf.*, pp. 203-204, October 2005.
6. E. Yoshida and T. Tanaka, "A capacitorless 1T-DRAM technology using gate-induced drain-leakage (GIDL) current for low-power and high-embedded memory," *IEEE Trans. Electron Devices*, vol. 53, pp. 692-697, April 2006.
7. I. Ban, et al., "Floating body cell with independently-controlled double gates for high density memory," *IEDM Tech. Dig.*, pp. 573-576, December 2006.
8. T. Shino, et al., "Floating body RAM technology and its scalability to 32 nm node and beyond," *IEDM Tech. Dig.*, pp. 569-572, December 2006.
9. T. Hamamoto, et al., "A floating-body cell fully compatible with 90-nm CMOS technology node for a 128-nm DRAM and its scalability," *IEEE Trans. Electron Devices*, vol. 54, pp. 563-571, March 2007.
10. S. K. Moore, "Masters of memory," *IEEE Spectrum*, pp. 45-49, January 2007.
11. J. G. Fossum, Z. Lu, and V. P. Trivedi, "New insights on "capacitorless" floating-body DRAM cells," *IEEE Electron Device Lett.*, vol. 28, pp. 513-516, June 2007.
12. J. G. Fossum, L.-Q. Wang, J.-W. Yang, S.-H. Kim, and V. P. Trivedi, "Pragmatic Design of Nanoscale Multi-Gate CMOS," *Tech. Digest 2004 Internat. Electron Devices Meeting*, pp. 613-616, December 2004.
13. L. Mathew, et al., "Inverted-T Channel FET (ITFET)—A Novel Technology for 45 nm-and-Beyond CMOS," *IEDM Tech. Dig.*, pp. 731-734, December 2005.
14. J. G. Fossum, *UFDG User's Guide (Ver. 3.7)*. University of Florida, Gainesville, Fla., 2007.
15. *Taurus-2006 User's Manual*. Durham, N.C.: Synopsys, Inc., 2006.
16. V. Trivedi, J. G. Fossum, and M. M. Chowdhury, "Nanoscale FinFETs with gate-source/drain underlap," *IEEE Trans. Electron Devices*, vol. 52, pp. 56-62, January 2005.
17. S.-H. Kim, J. G. Fossum, and J.-W. Yang, "Modeling and significance of fringe capacitance in nonclassical CMOS devices with gate-source/drain underlap," *IEEE Trans. Electron Devices*, vol. 53, pp. 2143-2150, September 2006.
18. Z. Lu, et al., "A Novel Two-Transistor Floating-Body/Gate Cell for Low-Power Nanoscale Embedded DRAM," *IEEE Trans. Electron Devices*, vol. 55, p. 1511, June 2008.

19. S. Okhonin, et al., "New Generation of Z-RAM" *IEDM Tech. Dig.*, p. 925, December 2007.
20. V. P. Trivedi, et al., "Threshold voltage and bulk inversion effects in nonclassical CMOS devices with undoped ultra-thin bodies," *Solid-State Electron.*, vol. 51, p. 170, January 2007.

What is claimed is:

1. A dynamic memory, comprising:
a first transistor structure comprising a first body, a first gate, a first source, and a first drain; and
a second transistor structure comprising a second body, a second gate, a second source, and a second drain,
wherein the first body is coupled to the second gate such that the first body drives the second gate.

2. The dynamic memory according to claim 1, wherein the first gate is coupled to a word line, the first drain is coupled to a first bit line, and the second drain is coupled to a second bit line,
wherein the first source is coupled to the second source; and wherein the first source and the second source are coupled to a ground line.

3. The dynamic memory according to claim 1, wherein the first gate is coupled to a word line, the first drain is coupled to a first bit line, and the second drain is coupled to a second bit line
wherein the first source is coupled to the first drain such that the first source is coupled to the first bit line; and
wherein the second source is coupled to a ground line.

4. The dynamic memory according to claim 1, wherein the first transistor structure is a FinFET and the second transistor structure is a FinFET.

5. The dynamic memory according to claim 4, wherein the FinFET of the first transistor structure and the FinFET of the second transistor structure each have only one fin.

6. The dynamic memory according to claim 4, wherein the first body is coupled to the second gate through a planar p+ doped silicon-on-insulator layer connecting a first n-channel double gate (DG) FinFET and a second n-channel DG FinFET,
wherein the FinFET gates comprise near-midgap metal and p+ polysilicon.

7. The dynamic memory according to claim 1, wherein the first gate is coupled to a word line, the first drain is coupled to a first bit line, and the second drain is coupled to a second bit line,
wherein the first source is a first source region made of the same conductive type as that of the first body, whereby the first transistor structure functions as a gated diode.

8. The dynamic memory according to claim 7, wherein the first body is coupled to the second gate through the first source region.

9. The dynamic memory according to claim 8, wherein the first source region is made p+, the first body and the second body are p-type, and the first drain, second drain, and second source are n+.

10. The dynamic memory according to claim 8, wherein the first source region is made n+, the first body and the second body are n-type, and the first drain, second drain, and second source are p+.

11. The dynamic memory according to claim 1, wherein the first transistor structure and the second transistor structure are formed on bulk-silicon.

12. A method for controlling a memory having a dynamic memory cell comprising: a control structure comprising a first gate, a first source region, a first drain region, and a first body region; and a sensing transistor comprising a second gate, a second source region, and a second drain region, wherein the first body region is coupled to the second gate such that the first body region drives the second gate, the method comprising:
applying a voltage to a word line coupled to the first gate to store a '0' or a '1' value at the first body region during a write '0' operation or write '1' operation, respectively; and
sensing the stored '0' or '1' through a second bit line coupled to the second drain region.

13. The method according to claim 12, wherein the first source region and the second source region are coupled to a ground, wherein the applied voltage to the word line is capable of moving a voltage at the first body region to a level sufficiently above a threshold voltage of the sensing transistor having the second gate coupled to the first body region to store the '0' or to a level sufficiently below the threshold voltage to store the '1', the method further comprising:
applying a voltage to a first bit line coupled to the first drain region for performing the write '0' operation or the write '1' operation,
wherein the write '0' operation comprises charging the first body region; and
wherein the write '1' operation comprises discharging the first body region.

14. The method according to claim 12, wherein the first drain region is coupled to the first source region, wherein the second source region is coupled to a ground, wherein the applied voltage to the word line is capable of moving a voltage at the first body region to a level sufficiently above a threshold voltage of the sensing transistor having the second gate coupled to the first body region to store the '0' or to a level sufficiently below the threshold voltage to store the '1', the method further comprising:
applying a voltage to a first bit line coupled to both the first drain region and the first source region for performing the write '0' operation or the write '1' operation,
wherein the write '0' operation comprises charging the first body region; and
wherein the write '1' operation comprises discharging the first body region.

15. The method according to claim 12, wherein performing the read operation comprises:
sensing induced drain-current variation in the sensing transistor using a current-sense amplifier connected to the second bit line, wherein the body voltage ($V_{BS}$) of the control structure is first amplified with the sensing transistor.

16. The method according to claim 12, wherein performing the read operation comprises:
sensing through the second bit line a node voltage indicating inversion charge in the sensing transistor, wherein the voltage at the first body region of the control structure provides the inversion charge in the sensing transistor.

17. The method according to claim 12, wherein the first source region of the control structure is doped to have the same conductivity type as the first body region of the control structure such that the first source region and the first drain region of the first control structure provide a diode, wherein the second gate is coupled to the first body region through the first source region, the method further comprising:
applying a voltage to a first bit line coupled to the first drain region for performing the write '0' operation or the write '1' operation,
wherein the write '1' operation comprises charging the first body region using gate-induced drain leakage current; and wherein the write '0' operation comprises discharging the first body region utilizing a forward bias on the diode.

18. The method according to claim 12, wherein the dynamic memory cell is formed on a substrate, wherein no biasing is applied to the substrate.

19. The method according to claim 12, wherein the write '0' operation corresponds to charging the first body region and the write '1' operation corresponds to discharging the first body region.

20. The method according to claim 19, wherein the first source region is coupled to a ground and the first drain region is coupled to a first bit line, wherein charging and discharging the first body region comprises applying a first potential to the word line and applying a second potential to the first bit line to affect impact ionization current.

21. The method according to claim 19, wherein the first source region and the first drain region are coupled together and to a first bit line, wherein charging and discharging the first body region utilizes gate-induced drain leakage (GIDL) current.

22. The method according to claim 12, wherein the first the first source region of the control structure is doped to have a same conductivity type as the first body region such that the first source region and the first drain region form a diode, wherein the write '1' operation corresponds to charging the first body region and a write '0' operation corresponds to discharging the first body region, wherein charging and discharging utilizes gate-induced drain leakage (GIDL) current.

23. The dynamic memory according to claim 1, wherein the first transistor structure and the second transistor structure are formed on a silicon-on-insulator (SOI) substrate.

24. The dynamic memory according to claim 1, wherein the first transistor structure is stacked on the second transistor structure.

25. The dynamic memory according to claim 1, wherein the first body of the first transistor structure provides the second gate of the second transistor structure.

26. A dynamic memory comprising:
a bit line;
a first word line;
a first gated structure comprising a first conductive region, a second conductive region, a third conductive region, a first dielectric layer, and a first gate, wherein the first gate is on the second conductive region with the first dielectric layer disposed therebetween, wherein the first conductive region is at one side of the second conductive region and the third conductive region is at another side of the second conductive region; and
a second gated structure comprising a fourth conductive region, a fifth conductive region, a sixth conductive region, a second dielectric layer, and a second gate, wherein the second gate is on the fifth conductive region with the second dielectric layer disposed therebetween, wherein the fourth conductive region is at one side of the fifth conductive region and the sixth conductive region is at another side of the fifth conductive region;
wherein the first gate is coupled to the first word line, wherein the second conductive region is coupled to the second gate, wherein the fourth conductive region is coupled to a ground, and wherein the sixth conductive region is coupled to the bit line.

27. The dynamic memory according to claim 26, wherein the first conductive region, the third conductive region, the fourth conductive region, and the sixth conductive region are n-type regions, wherein the second conductive region and the fifth conductive region are p-type regions.

28. The dynamic memory according to claim 27, further comprising a high concentration p-type region electrically connecting the second conductive region to the second gate.

29. The dynamic memory according to claim 26, wherein the third conductive region, the fourth conductive region, and the sixth conductive region are n-type regions, wherein the first conductive region, the second conductive region, and the fifth conductive region are p-type regions,
wherein the first conductive region has a higher p-type concentration than that of the second conductive region.

30. The dynamic memory according to claim 26, wherein the bit line is a second bit line of a dynamic memory cell for reading data stored in the dynamic memory cell, wherein the third conductive region is coupled to a first bit line of the dynamic memory cell.

31. The dynamic memory according to claim 30, wherein the first conductive region is coupled to the ground.

32. The dynamic memory according to claim 30, wherein the first conductive region is coupled to the first bit line to receive a same signal as the third conductive region.

33. The dynamic memory according to claim 30, wherein the first conductive region and the second conductive region are of a same conductive type, wherein the first conductive region has a higher ion concentration than the second conductive region, wherein the second gate is coupled to the second conductive region through the first conductive region.

34. The dynamic memory according to claim 26, wherein the first conductive region is on the fourth conductive region, wherein the second conductive region is on the second gate, wherein the third conductive region is on the sixth conductive region.

35. A dynamic memory, comprising:
a first transistor structure comprising a first body, a first gate, a first source, and a first drain; and
a second transistor structure comprising a second body, a second gate, a second source, and a second drain,
wherein the first gate is coupled to a word line, the first body is coupled to the second gate, the first drain is coupled to a first bit line, and the second drain is coupled to a second bit line.

* * * * *

UNITED STATES PATENT AND TRADEMARK OFFICE
CERTIFICATE OF CORRECTION

PATENT NO. : 8,498,140 B2
APPLICATION NO. : 12/681289
DATED : July 30, 2013
INVENTOR(S) : Jerry G. Fossum et al.

It is certified that error appears in the above-identified patent and that said Letters Patent is hereby corrected as shown below:

In the Specification

Column 12,
Line 64, "to than the" should read --to form the--.

Column 13,
Line 52, "-0.72 (FIG. 1)" should read -- -0.72 (FIG. 14)--.
Line 62, "that the" should read --that of the--.

In the Claims

Column 15,
Lines 24-25, "bit line" should read --bit line,--.

Column 17,
Lines 21-22, "wherein the first the first source region" should read
 --wherein the first source region--.

Signed and Sealed this
Twenty-fourth Day of December, 2013

Margaret A. Focarino
*Commissioner for Patents of the United States Patent and Trademark Office*

UNITED STATES PATENT AND TRADEMARK OFFICE
CERTIFICATE OF CORRECTION

PATENT NO. : 8,498,140 B2  Page 1 of 1
APPLICATION NO. : 12/681289
DATED : July 30, 2013
INVENTOR(S) : Fossum et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 503 days.

Signed and Sealed this
Fifteenth Day of September, 2015

Michelle K. Lee
*Director of the United States Patent and Trademark Office*